United States Patent
Spencer et al.

(10) Patent No.: US 10,297,755 B2
(45) Date of Patent: May 21, 2019

(54) OXYGEN SUBSTITUTED BENZOCLOBUTENES DERIVED COMPOSITIONS FOR ELECTRONIC DEVICES

(71) Applicants: Dow Global Technologies LLC, Midland, MI (US); Rohm and Haas Electronic Materials LLC, Marlborough, MA (US)

(72) Inventors: Liam P. Spencer, Manvel, TX (US); Nolan T. McDougal, Houston, TX (US); Peter Trefonas, III, Medway, MA (US); David D. Devore, Midland, MI (US)

(73) Assignees: Dow Global Technologies LLC, Midland, MI (US); Rohm and Haas Electronic Materials LLC, Marlborough, MA (US)

(*) Notice: Subject to any disclaimer, the term of this patent is extended or adjusted under 35 U.S.C. 154(b) by 0 days.

(21) Appl. No.: 15/318,407

(22) PCT Filed: Aug. 19, 2015

(86) PCT No.: PCT/US2015/045923
§ 371 (c)(1),
(2) Date: Dec. 13, 2016

(87) PCT Pub. No.: WO2016/028906
PCT Pub. Date: Feb. 25, 2016

(65) Prior Publication Data
US 2017/0170398 A1     Jun. 15, 2017

Related U.S. Application Data

(60) Provisional application No. 62/039,935, filed on Aug. 21, 2014.

(51) Int. Cl.
*C08G 73/06* (2006.01)
*H01L 51/00* (2006.01)
*H01L 51/50* (2006.01)

(52) U.S. Cl.
CPC ...... *H01L 51/0035* (2013.01); *C08G 73/0672* (2013.01); *H01L 51/004* (2013.01); *H01L 51/0043* (2013.01); *H01L 51/5056* (2013.01); *H01L 51/0003* (2013.01)

(58) Field of Classification Search
USPC ........................................................ 525/417
See application file for complete search history.

(56) References Cited

U.S. PATENT DOCUMENTS

| 7,893,160 | B2 | 2/2011 | Inbasekaran et al. |
| 2004/0004433 | A1 | 1/2004 | Lamansky et al. |
| 2007/0096082 | A1 | 5/2007 | Gaynor et al. |
| 2007/0181874 | A1 | 8/2007 | Prakash et al. |
| 2008/0309229 | A1 | 12/2008 | Steudel et al. |
| 2008/0315757 | A1 | 12/2008 | McKiernan et al. |
| 2010/0133566 | A1 | 6/2010 | Towns et al. |
| 2011/0042661 | A1 | 2/2011 | Endo et al. |
| 2011/0065222 | A1 | 3/2011 | Meyer et al. |
| 2011/0089411 | A1 | 4/2011 | Xia et al. |
| 2011/0095278 | A1 | 4/2011 | Sugita et al. |
| 2011/0198573 | A1 | 8/2011 | Iida et al. |
| 2012/0003790 | A1 | 1/2012 | Brown et al. |
| 2014/0193937 | A1 | 7/2014 | Humphries et al. |

FOREIGN PATENT DOCUMENTS

| CN | 102329411 A | 1/2012 |
| JP | 2010062120 A | 3/2010 |
| WO | 2012/052704 A2 | 4/2012 |
| WO | 2012/175975 A2 | 12/2012 |
| WO | 2013/007966 A1 | 1/2013 |
| WO | 2016026451 A1 | 2/2016 |
| WO | 2016028902 A1 | 2/2016 |

OTHER PUBLICATIONS

Dobish, et al Polymer Chemistry 2012, 3, 857-860.
Kirchhoff, et al Progress in Polymer Science 1993, 18, 85-185.
PCT/US2015/045923,International Search Report and Written Opinion dated Nov. 5, 2015.
PCT/US2015/045923, International Preliminary Report on Patentability dated Mar. 2, 2017.
Search report for corresponding China Application No. 201580044625.0 dated Sep. 5, 2018.

*Primary Examiner* — Terressa Boykin
(74) *Attorney, Agent, or Firm* — S. Matthew Cairns

(57) ABSTRACT

The invention provides compositions comprising BCB-functionalized materials for use in OLEDs applications. The inventive compositions can be used to form hole-transporting materials for use in electroluminescent devices. In particular, the invention provides for compositions, charge transport film layers, and light emitting devices, comprising, or formed from, a polymer, which comprises one or more polymerized units derived from Structure (A).

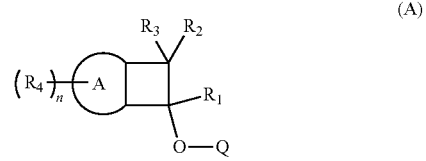

11 Claims, No Drawings

OXYGEN SUBSTITUTED BENZOCLOBUTENES DERIVED COMPOSITIONS FOR ELECTRONIC DEVICES

REFERENCE TO RELATED APPLICATIONS

This application claims the benefit of U.S. Provisional Application No. 62/039,935, filed Aug. 21, 2014, and incorporated herein by reference.

BACKGROUND

Organic light emitting diodes (OLEDs) are display devices that employ stacks of films containing organic aromatic compounds as electron transport layers (ETLs) and hole transport layers (HTLs). New material discovery for electron transport layer (ETL) and hole transport layers (HTL) in organic light emitting diodes (OLEDs) have been targeted to improve device performance and lifetimes. In the case of the HTL layer, the process, by which the layer is deposited, is critical for its end-use application. Methods for depositing the HTL layer, in small display applications, involve evaporation of a small organic compound, with a fine metal mask, to direct the deposition. In the case of large displays, this approach is not practical from a material usage and high throughput perspective. With these findings in mind, new processes are needed to deposit HTLs that satisfy these challenges, and which can be directly applied to large display applications.

One approach that appears promising is a solution process which involves the deposition of a small molecule, followed by crosslinking or polymerization chemistry. There have been extensive efforts in this area, along these lines; however these approaches have their own shortcomings. In particular, the mobility of the charges in the HTL layer becomes reduced, as a result of crosslinking or polymerization chemistry. This reduced hole mobility leads to poor device lifetime and difficulty in maintaining a charge balanced device. This imbalance can also lead to device efficiency issues. Also, the current technology can hardly produce an insoluble HTL film, with few to no reactive end groups, at desirable process conditions.

Benzocyclobutene (BCB) chemistries and their use in OLEDs are described in the following: US20040004433, US20080315757, US20080309229, US20100133566, US20110095278, US20110065222, US20110198573, US20110042661, JP2010062120, U.S. Pat. No. 7,893,160, US20110089411, US20070181874, US20070096082, CN102329411, US20120003790, WO2012052704, WO2012175975, WO2013007966, International Application No. PCT/CN14/084915 (filed Aug. 21, 2014) and International Application No. PCT/CN14/084918 (filed Aug. 21, 2014).

However, there remains a need for new compositions for improved hole-transporting materials, and for improved processing of the same. These needs have been met by the following invention.

SUMMARY OF INVENTION

The provides a light emitting device comprising a polymeric charge transfer layer, wherein the polymeric charge transfer layer is formed from a composition comprising a polymer,
said polymer comprising one or more polymerized units derived from Structure A:

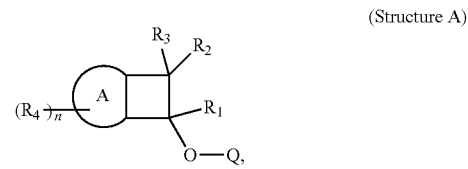

(Structure A)

wherein for Structure A, A is selected from an aromatic moiety or a heteroaromatic moiety; and
wherein R1 through R3 are each independently selected from the following: hydrogen, deuterium, a hydrocarbyl, a substituted hydrocarbyl, a heterohydrocarbyl, a substituted heterohydrocarbyl, halogen, cyano, a aryl, a substituted aryl, a heteroaryl, a substituted heteroaryl; and
wherein n is from 1 to 10; and each R4 is independently selected from the following: hydrogen, deuterium, a hydrocarbyl, a substituted hydrocarbyl, a heterohydrocarbyl, a substituted heterohydrocarbyl, halogen, cyano, a aryl, a substituted aryl, a heteroaryl, a substituted heteroaryl; and
wherein each R4 group is independently bonded to A; and
wherein O is oxygen; and
wherein Q is selected from the following: hydrogen, deuterium, a hydrocarbyl, a substituted hydrocarbyl, a heterohydrocarbyl, a substituted heterohydrocarbyl, a halogen, a cyano, an aryl, a substituted aryl, a heteroaryl, a substituted heteroaryl; and
wherein two or more of R1 through R4 may optionally form one or more ring structures.

The invention also provides a composition comprising a polymer which comprises one or more polymerized units derived from Structure A:

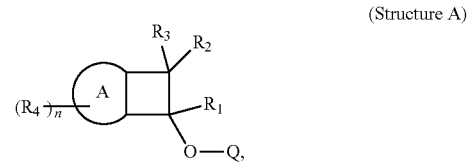

(Structure A)

wherein for Structure A, A is selected from an aromatic moiety or a heteroaromatic moiety; and
R1 through R3 are each independently selected from the following: hydrogen, deuterium, a hydrocarbyl, a substituted hydrocarbyl, a heterohydrocarbyl, a substituted heterohydrocarbyl, halogen, cyano, an aryl, a substituted aryl, a heteroaryl, a substituted heteroaryl; and
wherein n is from 1 to 10; and each R4 is independently selected from the following: hydrogen, deuterium, a hydrocarbyl, a substituted hydrocarbyl, a heterohydrocarbyl, a substituted heterohydrocarbyl, halogen, cyano, a aryl, a substituted aryl, a heteroaryl, a substituted heteroaryl; and
wherein each R4 group is independently bonded to A; and
wherein O is oxygen; and
wherein Q is selected from the following: hydrogen, deuterium, a hydrocarbyl, a substituted hydrocarbyl, a heterohydrocarbyl, a substituted heterohydrocarbyl, a halogen, a cyano, an aryl, a substituted aryl, a heteroaryl, a substituted heteroaryl; and
wherein two or more of R1 through R4 may optionally form one or more ring structures.

The invention also provides a composition comprising at least one compound selected from Structure 1:

(Structure 1)

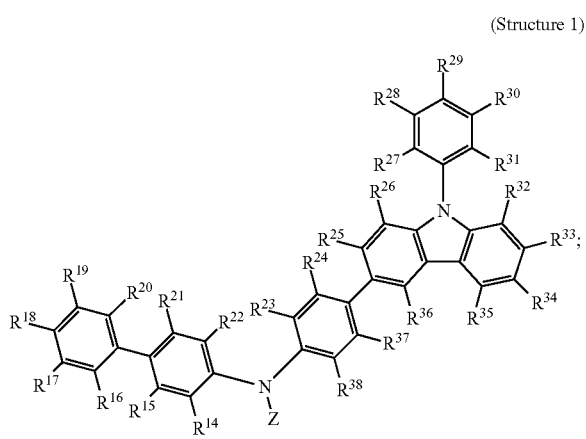

wherein groups R14 to R38 are each, independently, selected from a hydrogen, deuterium, hydrocarbyl, a substituted hydrocarbyl, a cyano, an alkoxy, an aryloxy, or $NR'_2$, and wherein each R' is independently hydrogen, an alkyl, a substituted alkyl, a heteroalkyl, or a substituted heteroalkyl; and wherein two or more of R14 to R38 may optionally form one or more ring structures; and wherein at least one and preferably two of groups R14 to R38 are each, independently, selected from the following Structure 2:

(Structure 2)

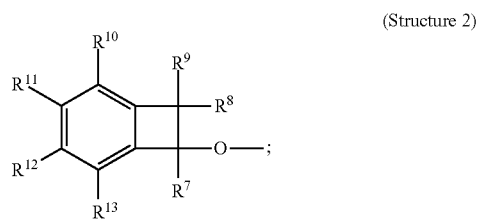

wherein groups R7 to R13 are each, independently, selected from hydrogen, deuterium, a hydrocarbyl, a substituted hydrocarbyl, a cyano, an alkoxy, or an aryloxy; and wherein, for Structure 1, Z is selected from an aryl, a substituted aryl, a heteroaryl, or a substituted heteroaryl.

The invention also provides a composition comprising a polymer, which comprises one or more polymerized units derived from Structure A:

(Structure A)

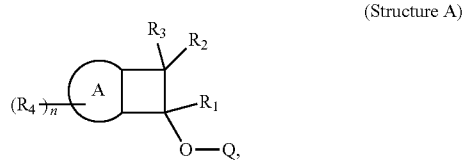

wherein for Structure A, A is selected from a substituted aromatic moiety or a substituted heteroaromatic moiety; and wherein R1 through R3 are each independently selected from the following: hydrogen, deuterium, a hydrocarbyl, a substituted hydrocarbyl, a heterohydrocarbyl, a substituted heterohydrocarbyl, halogen, cyano, a aryl, a substituted aryl, a heteroaryl, a substituted heteroaryl; and wherein n is from 1 to 10; and each R4 is independently selected from the following: hydrogen, deuterium, a hydrocarbyl, a substituted hydrocarbyl, a heterohydrocarbyl, a substituted heterohydrocarbyl, halogen, cyano, a aryl, a substituted aryl, a heteroaryl, a substituted heteroaryl; and wherein each R4 group is independently bonded to A; and wherein O is oxygen; and wherein Q is selected from the following: hydrogen, deuterium, a hydrocarbyl, a substituted hydrocarbyl, a heterohydrocarbyl, a substituted heterohydrocarbyl, a halogen, a cyano, an aryl, a substituted aryl, a heteroaryl, a substituted heteroaryl; and wherein two or more of R1 through R4 may optionally form one or more ring structures.

DETAILED DESCRIPTION

Inventive compositions have been discovered that reduce the drawbacks of the art discussed above. It has been discovered that by using one attachment point on the molecule, we can minimize the energy required for rearrangement during oxidation. Furthermore, this flexibility will also lead to more efficient chain stacking, which can bring the molecular cores into close proximity to each other. This approach will improve hole transport in the HTL layer via thru-space interactions. Furthermore, the chemistry described in this invention can also satisfy temperature and time considerations relating to desirable process conditions. See, for example, schematics 1 and 2 below.

Schematic 1

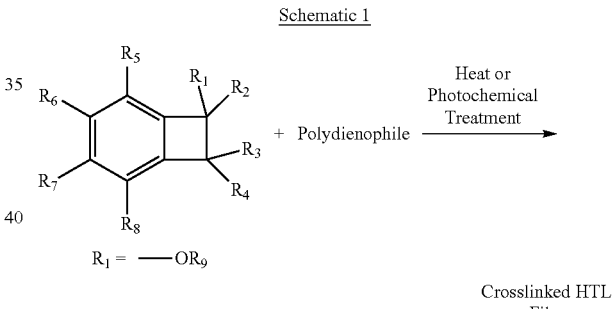

Schematic 2

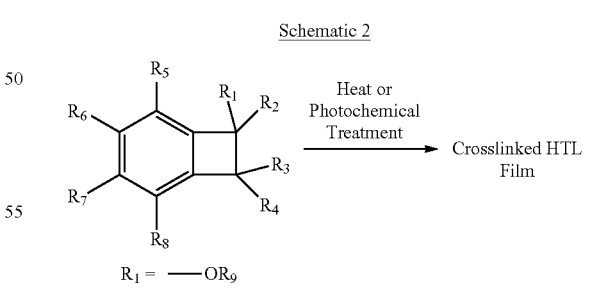

In comparison to other prior art that utilizes BCB chemistry, it has been discovered that the invention describes chemistry that can be used at substantially lower temperatures. It is been documented in the open literature that the substitution of oxygen-based donors, at the $R_1$-$R_4$ positions above, has a dramatic effect on the ring-opening temperature of the BCB (Dobish, J. N.; Hamilton, S. K.; Harth, E. *Polymer Chemistry* 2012, 3, 857-860); this phenomenon has yet to be utilized for OLED-based applications. With unsubstituted BCB derivatives, the ring opening temperatures has been noted to occur at temperatures ~250° C. (Kirchhoff, R. A.; Bruza, K. J. *Progress in Polymer Science* 1993, 18, 85-185). In this invention, the substitution of an oxygen donor results in a significant reduction in the ring opening temperatures to values between 100-120° C., which has significant process advantages over conventional chemistry of the art. Once a reactive o-quinodimethane moiety has been formed, Diels-Alder reactions can occur to generate new C—C bonds in either a 1- or 2-component approach. Furthermore, it has been discovered the two-component approach, as described herein, with a reactive o-quinodimethane moiety and polydienophile has yet to be reported.

It has been discovered that the inventive composition can be used as hole transporting materials in OLEDs, and achieves high efficiency, without a second organic charge transport compound.

It has been discovered that the inventive composition can be used be used as hole transporting layers in solution-processed OLEDs.

It has been discovered that the inventive composition can be used as hole transporting materials in OLED devices.

It has been discovered that an inventive film can be cross linked thermally and/or with radiation, and further, without a crosslinking agent.

As discussed above, the invention provides, in a first aspect, a light emitting device comprising a polymeric charge transfer layer, wherein the polymeric charge transfer layer is formed from a composition comprising a polymer, said polymer comprising one or more polymerized units derived from Structure A, as described above:

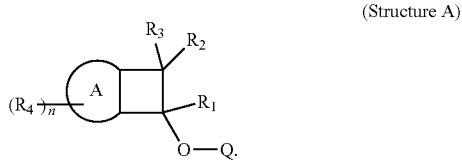

(Structure A)

In one embodiment, the polymer comprising one or more polymerized units derived from Structure A:

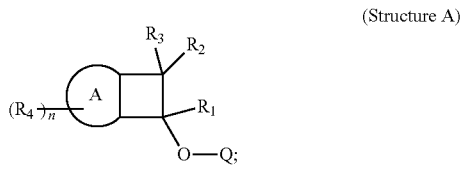

(Structure A)

wherein A is independently chosen from an aromatic moiety or a heteroaromatic moiety; and wherein R1 through R3 are each independently selected from the following: hydrogen; deuterium; a $C_1$-$C_{100}$, further a $C_3$-$C_{100}$, further a $C_{10}$-$C_{100}$, further a $C_{20}$-$C_{100}$, further a $C_{30}$-$C_{100}$ hydrocarbyl; a $C_1$-$C_{100}$, further a $C_3$-$C_{100}$, further a $C_{10}$-$C_{100}$, further a $C_{20}$-$C_{100}$, further a $C_{30}$-$C_{100}$ substituted hydrocarbyl; a $C_1$-$C_{100}$, further a $C_3$-$C_{100}$, further a $C_{10}$-$C_{100}$, further a $C_{20}$-$C_{100}$, further a $C_{30}$-$C_{100}$ heterohydrocarbyl; a $C_1$-$C_{100}$, further a $C_3$-$C_{100}$, further a $C_{10}$-$C_{100}$, further a $C_{20}$-$C_{100}$, further, a $C_{30}$-$C_{100}$ substituted heterohydrocarbyl; a halogen; a cyano; a $C_5$-$C_{100}$, further a $C_6$-$C_{100}$, further a $C_{10}$-$C_{100}$, further a $C_{20}$-$C_{100}$, further a $C_{30}$-$C_{100}$ aryl; a $C_5$-$C_{100}$, further a $C_6$-$C_{100}$, further a $C_{10}$-$C_{100}$, further a $C_{20}$-$C_{100}$, further a $C_{30}$-$C_{100}$ substituted aryl; a $C_5$-$C_{100}$, further a $C_6$-$C_{100}$, further a $C_{10}$-$C_{100}$, further a $C_{20}$-$C_{100}$, further a $C_{30}$-$C_{100}$ heteroaryl; a $C_5$-$C_{100}$, further a $C_6$-$C_{100}$, further a $C_{10}$-$C_{100}$, further a $C_{20}$-$C_{100}$, further a $C_{30}$-$C_{100}$ substituted heteroaryl; and wherein n is from 1 to 10; and each R4 is independently selected from the following: hydrogen; deuterium; a $C_1$-$C_{100}$, further a $C_3$-$C_{100}$, further a $C_{10}$-$C_{100}$, further a $C_{20}$-$C_{100}$, further a $C_{30}$-$C_{100}$ hydrocarbyl; a $C_1$-$C_{100}$, further a $C_3$-$C_{100}$, further a $C_{10}$-$C_{100}$, further a $C_{20}$-$C_{100}$, further a $C_{30}$-$C_{100}$ substituted hydrocarbyl, a $C_1$-$C_{100}$, further a $C_3$-$C_{100}$, further a $C_{10}$-$C_{100}$, further a $C_{20}$-$C_{100}$, further a $C_{30}$-$C_{100}$ heterohydrocarbyl; a $C_1$-$C_{100}$, further a $C_3$-$C_{100}$, further a $C_{10}$-$C_{100}$, further a $C_{20}$-$C_{100}$, further a $C_{30}$-$C_{100}$ substituted heterohydrocarbyl; a halogen; a cyano; a $C_5$-$C_{100}$, further a $C_6$-$C_{100}$, further a $C_{10}$-$C_{100}$, further a $C_{20}$-$C_{100}$, further a $C_{30}$-$C_{100}$ aryl; a $C_5$-$C_{100}$, further a $C_6$-$C_{100}$, further a $C_{10}$-$C_{100}$, further a $C_{20}$-$C_{100}$, further a $C_{30}$-$C_{100}$ substituted aryl; a $C_5$-$C_{100}$, further a $C_6$-$C_{100}$, further a $C_{10}$-$C_{100}$, further a $C_{20}$-$C_{100}$, further a $C_{30}$-$C_{100}$ heteroaryl; a $C_5$-$C_{100}$, further a $C_6$-$C_{100}$, further a $C_{10}$-$C_{100}$, further a $C_{20}$-$C_{100}$, further a $C_{30}$-$C_{100}$ substituted heteroaryl; and wherein O is oxygen; and wherein Q is selected from the following: hydrogen; deuterium; a $C_1$-$C_{100}$, further a $C_3$-$C_{100}$, further a $C_{10}$-$C_{100}$, further a $C_{20}$-$C_{100}$, further a $C_{30}$-$C_{100}$ hydrocarbyl; a $C_1$-$C_{100}$, further a $C_3$-$C_{100}$, further a $C_{10}$-$C_{100}$, further a $C_{20}$-$C_{100}$, further a $C_{30}$-$C_{100}$ substituted hydrocarbyl; a $C_1$-$C_{100}$, further a $C_3$-$C_{100}$, further a $C_{10}$-$C_{100}$, further a $C_{20}$-$C_{100}$, further a $C_{30}$-$C_{100}$ heterohydrocarbyl; a $C_1$-$C_{100}$, further a $C_3$-$C_{100}$, further a $C_{10}$-$C_{100}$, further a $C_{20}$-$C_{100}$, further a $C_{30}$-$C_{100}$ substituted heterohydrocarbyl; a halogen; a cyano; a $C_5$-$C_{100}$, further a $C_6$-$C_{100}$, further a $C_{10}$-$C_{100}$, further a $C_{20}$-$C_{100}$, further a $C_{30}$-$C_{100}$ aryl; a $C_5$-$C_{100}$, further a $C_6$-$C_{100}$, further a $C_{10}$-$C_{100}$, further a $C_{20}$-$C_{100}$, further a $C_{30}$-$C_{100}$ substituted aryl; a $C_5$-$C_{100}$, further a $C_6$-$C_{100}$, further a $C_{10}$-$C_{100}$, further a $C_{20}$-$C_{100}$, further a $C_{30}$-$C_{100}$ heteroaryl; a $C_5$-$C_{100}$, further a $C_6$-$C_{100}$, further a $C_{10}$-$C_{100}$, further a $C_{20}$-$C_{100}$, further a $C_{30}$-$C_{100}$ substituted heteroaryl; and wherein two or more of R1 through R4 may optionally form one or more ring structures.

Substituents include, but are not limited to, OR', NR'$_2$, PR'$_2$, P(=O)R'$_2$, SiR'$_3$; where each R' is a $C_1$-$C_{120}$ hydrocarbyl group.

An inventive device may comprise a combination of two or more embodiments as described herein.

Structure A may comprise a combination of two or more embodiments as described herein.

As used herein, R1=R$_1$, R2=R$_2$, R3=R$_3$, and so forth.

In one embodiment, the polymer further comprises one or more polymerized units derived from a cross-linking agent with the general Structure B:

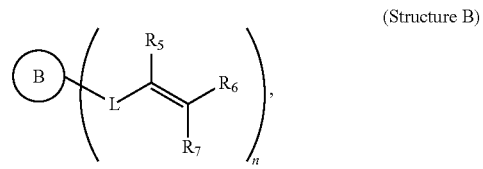

(Structure B)

wherein, for Structure B, B is an aromatic moiety, a heteroaromatic moiety, a $C_1$-$C_{50}$ hydrocarbyl, a $C_1$-$C_{50}$ substituted hydrocarbyl, a $C_1$-$C_{50}$ heterohydrocarbyl, or a $C_1$-$C_{50}$ substituted heterohydrocarbyl; and wherein R5 through R7 are each independently selected from the following: hydrogen, deuterium, a $C_1$-$C_{50}$ hydrocarbyl, a $C_1$-$C_{50}$ substituted hydrocarbyl, a $C_1$-$C_{50}$ heterohydrocarbyl, a $C_1$-$C_{50}$ substituted heterohydrocarbyl, halogen, cyano, a $C_5$-$C_{50}$ aryl, a $C_5$-$C_{50}$ substituted aryl, a $C_5$-$C_{50}$ heteroaryl, a $C_5$-$C_{50}$ substituted heteroaryl; and wherein n is from 1 to 25; and wherein each "-L-CR5=CR6R7" group is independently bonded to B;

wherein L is selected from an aromatic moiety, a heteroaromatic moiety, a $C_1$-$C_{100}$ hydrocarbyl, a $C_1$-$C_{100}$ substituted hydrocarbyl, a $C_1$-$C_{100}$ heterohydrocarbyl, or a $C_1$-$C_{100}$ substituted heterohydrocarbyl, or wherein L is not present; and further L is selected from an aromatic moiety, a heteroaromatic moiety, a $C_1$-$C_{100}$ hydrocarbyl, a $C_1$-$C_{100}$ substituted hydrocarbyl, a $C_1$-$C_{100}$ heterohydrocarbyl, or a $C_1$-$C_{100}$ substituted heterohydrocarbyl;

wherein two or more of R5 through R7 may optionally form one or more ring structures.

In one embodiment, the cross-linking agent comprises at least three, further at least four, further at least five, C=C double bonds. In a further embodiment, the cross-linking agent comprises at least three —CR=CH$_2$ groups, wherein R is a substituted or unsubstituted C6-C100 hydrocarbon.

In one embodiment, the cross-linking agent comprises at least four, further at least five, further at least six, C=C double bonds. In a further embodiment, the cross-linking agent comprises at least three —CR=CH$_2$ groups, wherein R is a substituted or unsubstituted C6-C100 hydrocarbon. In a further embodiment, the cross-linking agent comprises at least three —CR=CH$_2$ groups, wherein R is a substituted or unsubstituted C6-C100 hydrocarbon.

In one embodiment, the cross-linking agent comprises at least seven, further at least eight, further at least nine, C=C double bonds. In a further embodiment, the cross-linking agent comprises at least three —CR=CH$_2$ groups, wherein R is a substituted or unsubstituted C6-C100 hydrocarbon.

In one embodiment, the cross-linking agent comprises at least four, further at least five, phenyl groups. In a further embodiment, the cross-linking agent comprises at least three —CR=CH$_2$ groups, wherein R is a substituted or unsubstituted C6-C100 hydrocarbon.

The cross-linking agent may comprise two or more embodiments as described herein.

In one embodiment, for Structure B, two or more of R5 through R7 do not optionally form one or more ring structures.

In one embodiment, the cross-linking agent is selected from the following 1i)-8i):

1i)

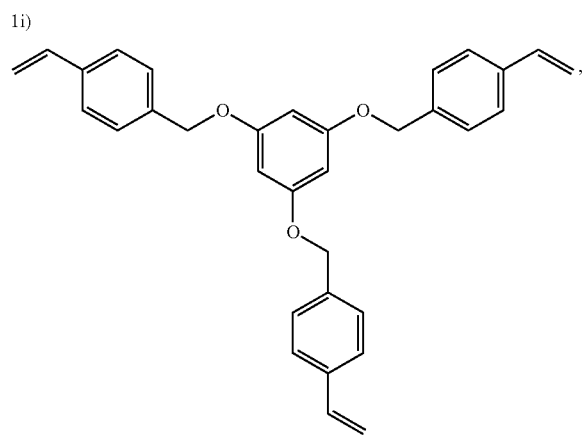

2i)

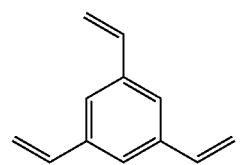

3i)

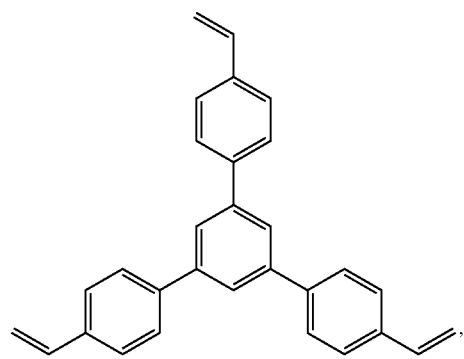

4i)

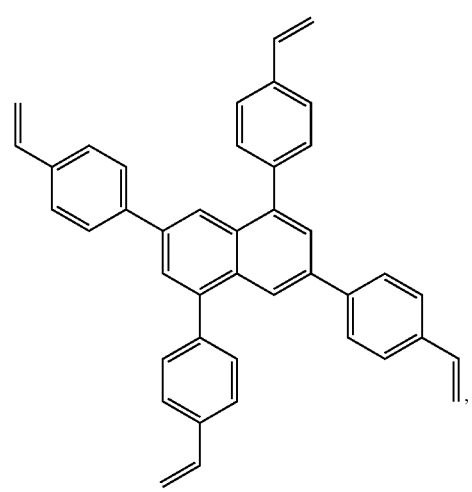

5i)

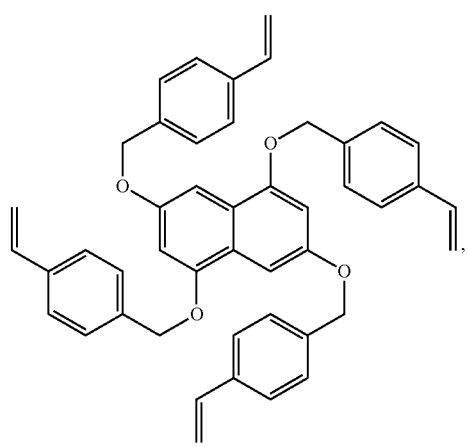

6i)

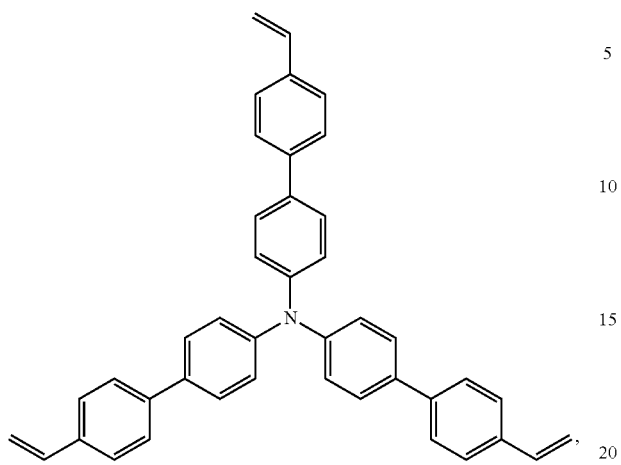

7i)

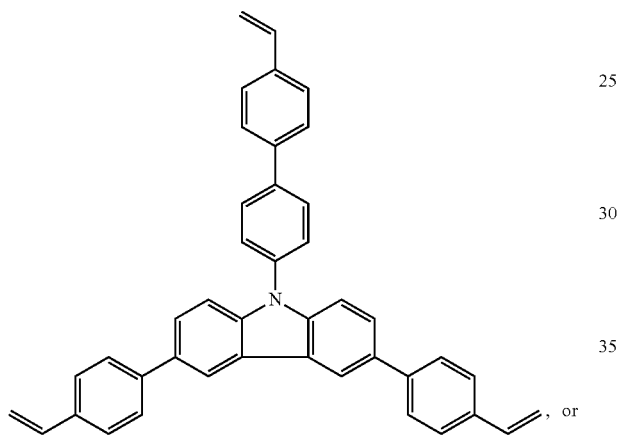, or

8i)

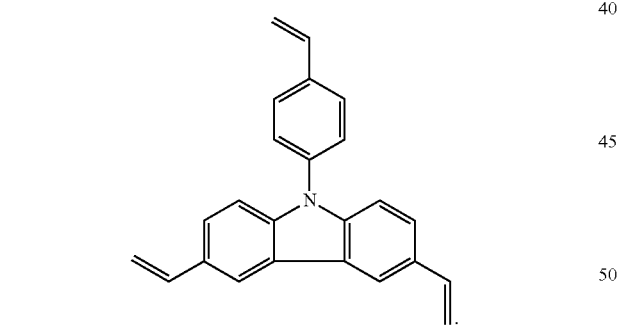

In one embodiment, Structure A is selected from the following A1)-A8):

A1)

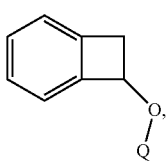

A2)

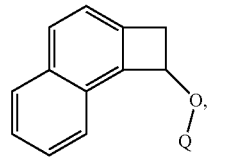

A3)

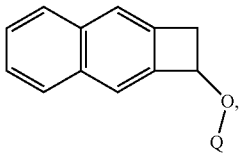

A4)

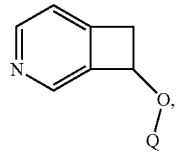

A5)

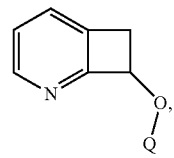

A6)

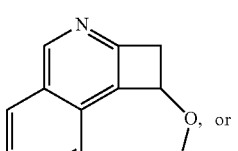

A7)

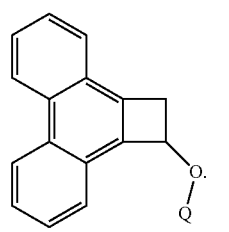, or

A8)

In one embodiment, Structure A comprises at least one, further at least two, further at three six C=C double bonds. In a further embodiment, Structure A comprises at least six carbon atoms. In a further embodiment, Structure A comprises less than 50, further less than 40, and further less than 30 carbon atoms.

In one embodiment, for Structure A, two or more of R1 through R4 do not optionally form one or more ring structures.

The invention also provides, in a second aspect, a composition comprising a polymer, which comprises one or more polymerized units derived from Structure A:

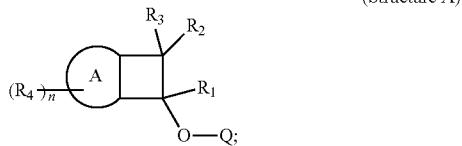

(Structure A)

wherein for Structure A, A is selected from an aromatic moiety or a heteroaromatic moiety, as described above.

The invention also provides, in a fourth aspect, a composition comprising a polymer which comprises one or more polymerized units derived from Structure A:

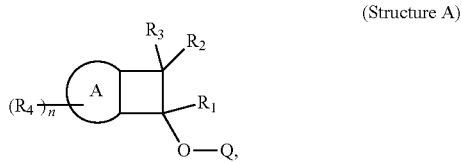

(Structure A)

wherein for Structure A, A is selected from a substituted aromatic moiety or a substituted heteroaromatic moiety, as described above.

The following embodiments apply to both the second aspect of the invention, as discussed above, and to the fourth aspect of the invention, as discussed above.

In one embodiment, R1 through R3 are each independently selected from the following: hydrogen; deuterium; a $C_1$-$C_{100}$, further a $C_3$-$C_{100}$, further a $C_{10}$-$C_{100}$, further a $C_{20}$-$C_{100}$, further a $C_{30}$-$C_{100}$ hydrocarbyl; a $C_1$-$C_{100}$, further a $C_3$-$C_{100}$, further a $C_{10}$-$C_{100}$, further a $C_{20}$-$C_{100}$, further a $C_{30}$-$C_{100}$ substituted hydrocarbyl; a $C_1$-$C_{100}$, further a $C_3$-$C_{100}$, further a $C_{10}$-$C_{100}$, further a $C_{20}$-$C_{100}$, further a $C_{30}$-$C_{100}$ heterohydrocarbyl; a $C_1$-$C_{100}$, further a $C_3$-$C_{100}$, further a $C_{10}$-$C_{100}$, further a $C_{20}$-$C_{100}$, further, a $C_{30}$-$C_{100}$ substituted heterohydrocarbyl; a halogen; a cyano; a $C_5$-$C_{100}$, further a $C_6$-$C_{100}$, further a $C_{10}$-$C_{100}$, further a $C_{20}$-$C_{100}$, further a $C_{30}$-$C_{100}$ aryl; a $C_5$-$C_{100}$, further a $C_6$-$C_{100}$, further a $C_{10}$-$C_{100}$, further a $C_{20}$-$C_{100}$, further a $C_{30}$-$C_{100}$ substituted aryl; a $C_5$-$C_{100}$, further a $C_6$-$C_{100}$, further a $C_{10}$-$C_{100}$, further a $C_{20}$-$C_{100}$, further a $C_{30}$-$C_{100}$ heteroaryl; a $C_5$-$C_{100}$, further a $C_6$-$C_{100}$, further a $C_{10}$-$C_{100}$, further a $C_{20}$-$C_{100}$, further a $C_{30}$-$C_{100}$ substituted heteroaryl; and wherein n is from 1 to 10; and each R4 is independently selected from the following: hydrogen; deuterium; a $C_1$-$C_{100}$, further a $C_3$-$C_{100}$, further a $C_{10}$-$C_{100}$, further a $C_{20}$-$C_{100}$, further a $C_{30}$-$C_{100}$ hydrocarbyl; a $C_1$-$C_{100}$, further a $C_3$-$C_{100}$, further a $C_{10}$-$C_{100}$, further a $C_{20}$-$C_{100}$, further a $C_{30}$-$C_{100}$ substituted hydrocarbyl, a $C_1$-$C_{100}$, further a $C_3$-$C_{100}$, further a $C_{10}$-$C_{100}$, further a $C_{20}$-$C_{100}$, further a $C_{30}$-$C_{100}$ heterohydrocarbyl; a $C_1$-$C_{100}$, further a $C_3$-$C_{100}$, further a $C_{10}$-$C_{100}$, further a $C_{20}$-$C_{100}$, further a $C_{30}$-$C_{100}$ substituted heterohydrocarbyl; a halogen; a cyano; a $C_5$-$C_{100}$, further a $C_6$-$C_{100}$, further a $C_{10}$-$C_{100}$, further a $C_{20}$-$C_{100}$, further a $C_{30}$-$C_{100}$ aryl; a $C_5$-$C_{100}$, further a $C_6$-$C_{100}$, further a $C_{10}$-$C_{100}$, further a $C_{20}$-$C_{100}$, further a $C_{30}$-$C_{100}$ substituted aryl; a $C_5$-$C_{100}$, further a $C_6$-$C_{100}$, further a $C_{10}$-$C_{100}$, further a $C_{20}$-$C_{100}$, further a $C_{30}$-$C_{100}$ heteroaryl; a $C_5$-$C_{100}$, further a $C_6$-$C_{100}$, further a $C_{10}$-$C_{100}$, further a $C_{20}$-$C_{100}$, further a $C_{30}$-$C_{100}$ substituted heteroaryl; and wherein O is oxygen; and wherein Q is selected from the following: hydrogen; deuterium; a $C_1$-$C_{100}$, further a $C_3$-$C_{100}$, further a $C_{10}$-$C_{100}$, further a $C_{20}$-$C_{100}$, further a $C_{30}$-$C_{100}$ hydrocarbyl; a $C_1$-$C_{100}$, further a $C_3$-$C_{100}$, further a $C_{10}$-$C_{100}$, further a $C_{20}$-$C_{100}$, further a $C_{30}$-$C_{100}$ substituted hydrocarbyl; a $C_1$-$C_{100}$, further a $C_3$-$C_{100}$, further a $C_{10}$-$C_{100}$, further a $C_{20}$-$C_{100}$, further a $C_{30}$-$C_{100}$ heterohydrocarbyl; a $C_1$-$C_{100}$, further a $C_3$-$C_{100}$, further a $C_{10}$-$C_{100}$, further a $C_{20}$-$C_{100}$, further a $C_{30}$-$C_{100}$ substituted heterohydrocarbyl; a halogen; a cyano; a $C_5$-$C_{100}$, further a $C_6$-$C_{100}$, further a $C_{10}$-$C_{100}$, further a $C_{20}$-$C_{100}$, further a $C_{30}$-$C_{100}$ aryl; a $C_5$-$C_{100}$, further a $C_6$-$C_{100}$, further a $C_{10}$-$C_{100}$, further a $C_{20}$-$C_{100}$, further a $C_{30}$-$C_{100}$ substituted aryl; a $C_5$-$C_{100}$, further a $C_6$-$C_{100}$, further a $C_{10}$-$C_{100}$, further a $C_{20}$-$C_{100}$, further a $C_{30}$-$C_{100}$ heteroaryl; a $C_5$-$C_{100}$, further a $C_6$-$C_{100}$, further a $C_{10}$-$C_{100}$, further a $C_{20}$-$C_{100}$, further a $C_{30}$-$C_{100}$ substituted heteroaryl; and wherein two or more of R1 through R4 may optionally form one or more ring structures.

Substituents include, but are not limited to, OR', NR'$_2$, PR'$_2$, P($=$O)R'$_2$, SiR'$_3$; where each R' is a $C_1$-$C_{120}$ hydrocarbyl group.

In one embodiment, the polymer further comprises one or more polymerized units derived from a cross-linking agent with the general Structure B:

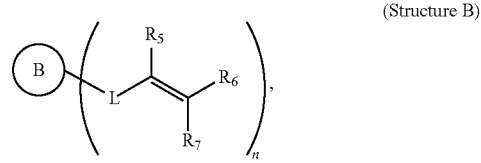

(Structure B)

wherein, for Structure B, B is an aromatic moiety, a heteroaromatic moiety, a $C_1$-$C_{50}$ hydrocarbyl, a $C_1$-$C_{50}$ substituted hydrocarbyl, a $C_1$-$C_{50}$ heterohydrocarbyl, or a $C_1$-$C_{50}$ substituted heterohydrocarbyl; and wherein R5 through R7 are each independently selected from the following: hydrogen, deuterium, a $C_1$-$C_{50}$ hydrocarbyl, a $C_1$-$C_{50}$ substituted hydrocarbyl, a $C_1$-$C_{50}$ heterohydrocarbyl, a $C_1$-$C_{50}$ substituted heterohydrocarbyl, halogen, cyano, a $C_5$-$C_{50}$ aryl, a $C_5$-$C_{50}$ substituted aryl, a $C_5$-$C_{50}$ heteroaryl, a $C_5$-$C_{50}$ substituted heteroaryl; and wherein n is from 1 to 25; and wherein each "-L-CR5=CR6R7" group is independently bonded to B;

wherein L is selected from an aromatic moiety, a heteroaromatic moiety, a $C_1$-$C_{100}$ hydrocarbyl, a $C_1$-$C_{100}$ substituted hydrocarbyl, a $C_1$-$C_{100}$ heterohydrocarbyl, or a $C_1$-$C_{100}$ substituted heterohydrocarbyl, or wherein L is not present; and further L is selected from an aromatic moiety, a heteroaromatic moiety, a $C_1$-$C_{100}$ hydrocarbyl, a $C_1$-$C_{100}$ substituted hydrocarbyl, a $C_1$-$C_{100}$ heterohydrocarbyl, or a $C_1$-$C_{100}$ substituted heterohydrocarbyl;

wherein two or more of R5 through R7 may optionally form one or more ring structures.

In one embodiment, the cross-linking agent comprises at least three, further at least four, further at least five, C=C double bonds. In a further embodiment, the cross-linking agent comprises at least three —CR=CH$_2$ groups, wherein R is a substituted or unsubstituted C6-C100 hydrocarbon.

In one embodiment, the cross-linking agent comprises at least four, further at least five, further at least six, C=C double bonds. In a further embodiment, the cross-linking agent comprises at least three —CR=CH$_2$ groups, wherein R is a substituted or unsubstituted C6-C100 hydrocarbon. In a further embodiment, the cross-linking agent comprises at least three —CR=CH$_2$ groups, wherein R is a substituted or unsubstituted C6-C100 hydrocarbon.

In one embodiment, the cross-linking agent comprises at least seven, further at least eight, further at least nine, C=C double bonds. In a further embodiment, the cross-linking agent comprises at least three —CR=CH$_2$ groups, wherein R is a substituted or unsubstituted C6-C100 hydrocarbon.

In one embodiment, the cross-linking agent comprises at least four, further at least five, phenyl groups. In a further embodiment, the cross-linking agent comprises at least three —CR=CH$_2$ groups, wherein R is a substituted or unsubstituted C6-C100 hydrocarbon.

In one embodiment, the cross-linking agent is selected from the following 1i)-8i):

1i)

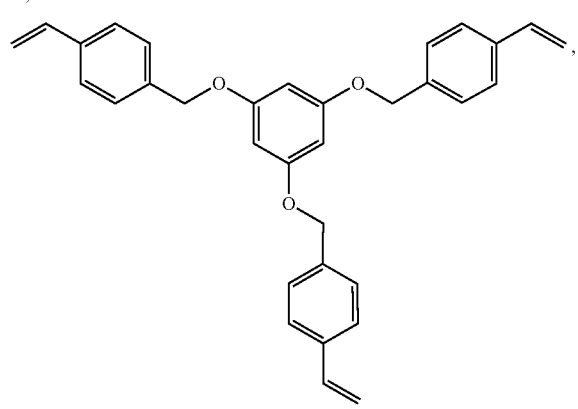

2i)

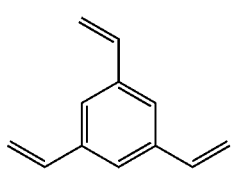

3i)

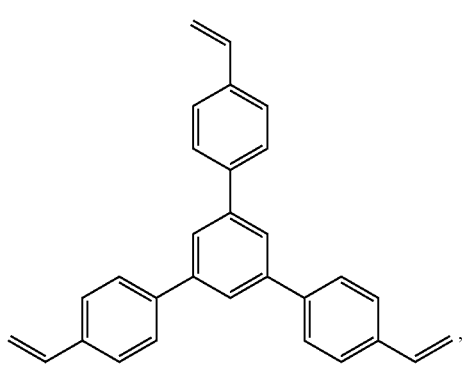

-continued

4i)

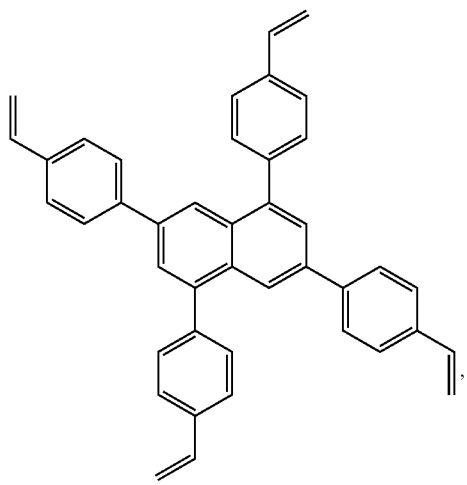

5i)

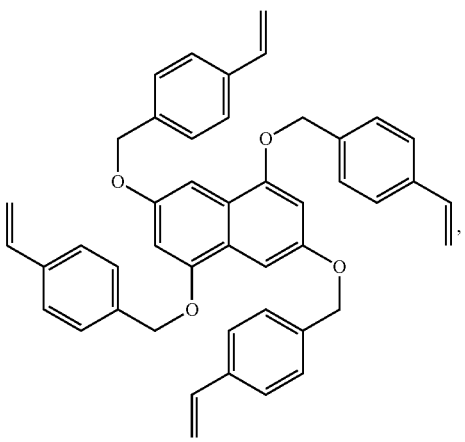

6i)

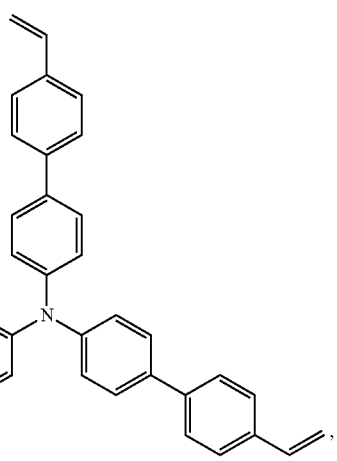

-continued

7i)

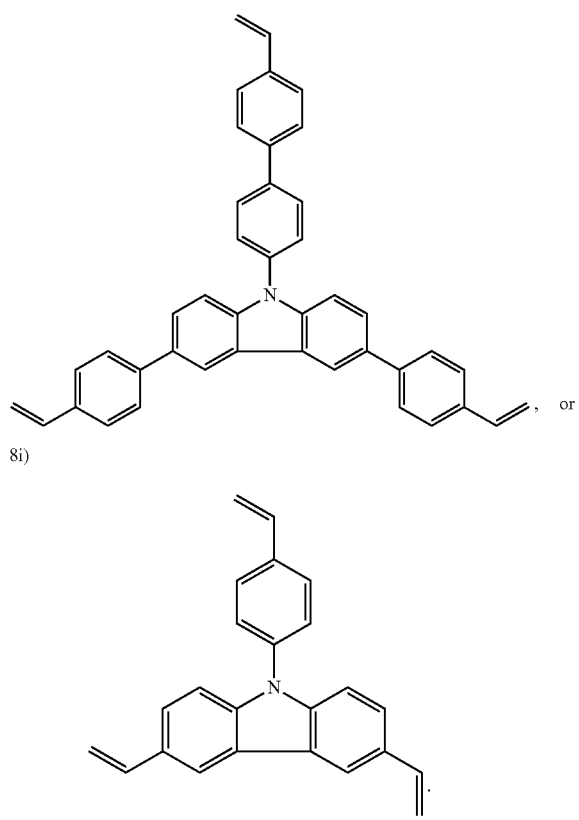, or

8i)

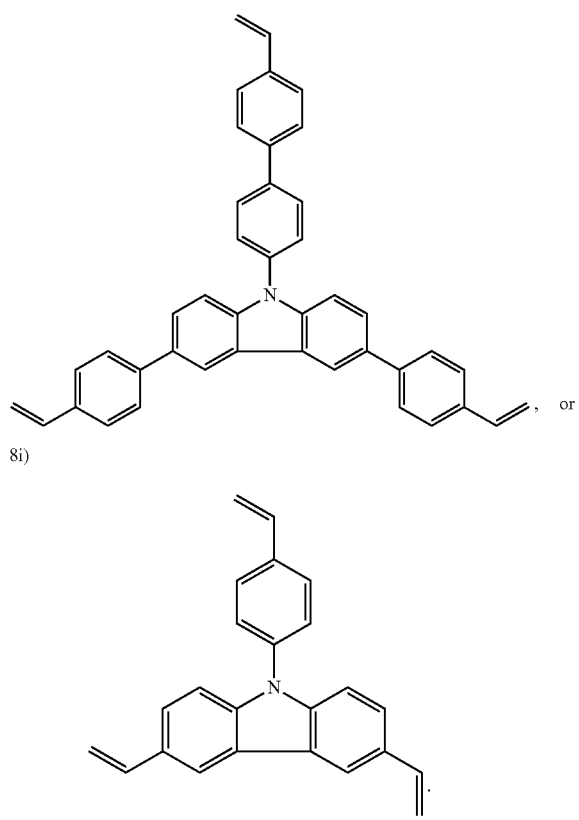

In one embodiment, two or more of R5 through R7 do not optionally form one or more ring structures.

The cross-linking agent may comprise two or more embodiments as described herein.

In one embodiment, Structure A is selected from the following A1)-A8):

A1)
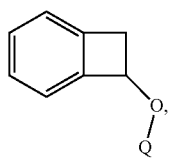

A2)
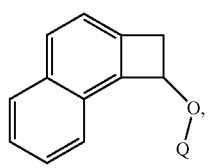

A3)
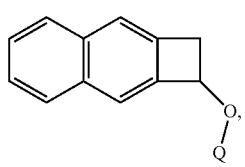

A4)
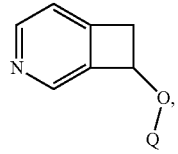

A5)
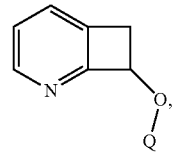

A6)
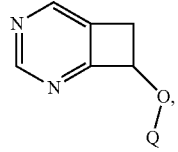

A7)
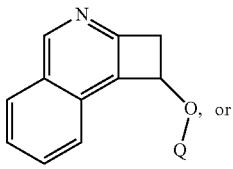, or

A8)
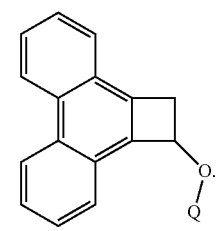

In one or more embodiments, for Structure A, two or more of R1 through R4 do not optionally form one or more ring structures.

The invention also provides a hole transporting solution-processed layer formed from an inventive composition as described herein, including a composition of one or more embodiments as described herein.

In one embodiment, the hole transporting solution-processed layer is prepared in an inert atmosphere with less than 50 ppm of $O_2$, based on total weight of components in atmosphere.

In one embodiment, the hole transporting solution-processed layer is formed from a solution coating onto a substrate, and wherein the coating is baked (thermally treated) at a temperature greater than, or equal to, 75 degrees Celsius. In a further embodiment, the coating is baked at a temperature from 75 to 300 degrees Celsius. In a further embodiment, the coating is contacted with a heat source to facilitate chemical reactions which lead to an increase in the molecular weight of the molecules of the polymer.

In one embodiment, the hole transporting solution-processed layer is insoluble in anisole.

In one embodiment, the hole transporting solution-processed layer shows less than 1 nm removal, following contact with anisole at 23 degrees Celsius, for 60 seconds.

In one embodiment, the hole transporting solution-processed layer is overcoated with another solvent-borne organic material to form an intermixed interface, and wherein the thickness of the intermixed interface is less than 1 nm.

The hole transporting solution-processed layer may comprise a combination of two or more embodiments as described herein.

The invention also provides a hole injection solution-processed layer formed from an inventive composition as described herein, including a composition of one or more embodiments as described herein.

The hole injection solution-processed layer may comprise a combination of two or more embodiments as described herein.

The invention also provides an emissive solution-processed layer formed from an inventive composition as described herein, including a composition of one or more embodiments as described herein.

The emissive solution-processed layer may comprise a combination of two or more embodiments as described herein.

The invention also provides an electronic device comprising an inventive hole transporting solution-processed layer, as described herein, or an inventive hole transporting solution-processed layer of one or more embodiments described herein.

The invention also provides an electronic device comprising an inventive hole injection solution-processed layer, as described herein, or an inventive hole injection solution-processed layer of one or more embodiments described herein.

The invention also provides an electronic device comprising an inventive emissive solution-processed layer, as described herein, or an inventive emissive solution-processed layer of one or more embodiments described herein.

The invention also provides, in a third aspect, a composition comprising at least one compound selected from Structure 1:

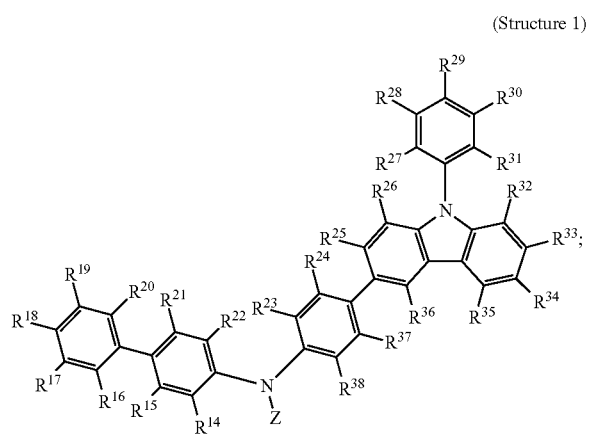

(Structure 1)

wherein groups R14 to R38 are each, independently, selected from hydrogen, deuterium, a hydrocarbyl, a substituted hydrocarbyl, a cyano, an alkoxy, an aryloxy, or $NR'_2$, and wherein each R' is independently hydrogen, an alkyl, a substituted alkyl, a heteroalkyl, or a substituted heteroalkyl; or hydrogen, an alkyl, or a substituted alkyl; or hydrogen or an alkyl; and wherein two or more of R14 to R38 may optionally form one or more ring structures; and wherein at least one and preferably at least two of groups R14 to R38 are each, independently, selected from the following Structure 2:

2.

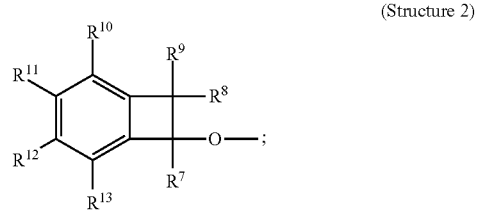

(Structure 2)

wherein groups R7 to R13 are each, independently, selected from hydrogen, deuterium, a hydrocarbyl, a substituted hydrocarbyl, a cyano, an alkoxy, or an aryloxy; and wherein, for Structure 1, Z is selected from an aryl, a substituted aryl, a heteroaryl, or a substituted heteroaryl.

The inventive composition may comprise a combination of two or more embodiments as described herein.

Structure 1 may comprise a combination of two or more embodiments as described herein.

In one embodiment, for Structure 1, two or more of R14 to R38 do not optionally form one or more ring structures.

Structure 2 may comprise a combination of two or more embodiments as described herein.

In one embodiment, two groups from R14 to R38 are each, independently, selected from the following Structure 2.

In one embodiment, Structure 2 is the following:

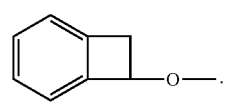

In one embodiment, for Structure 1, Z is selected from the following groups (i) through (vi):

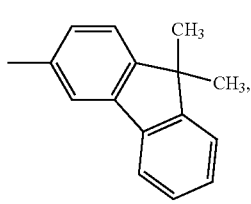

(i)

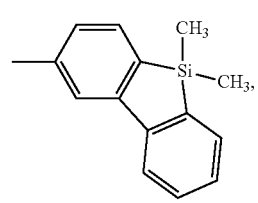

(ii)

-continued

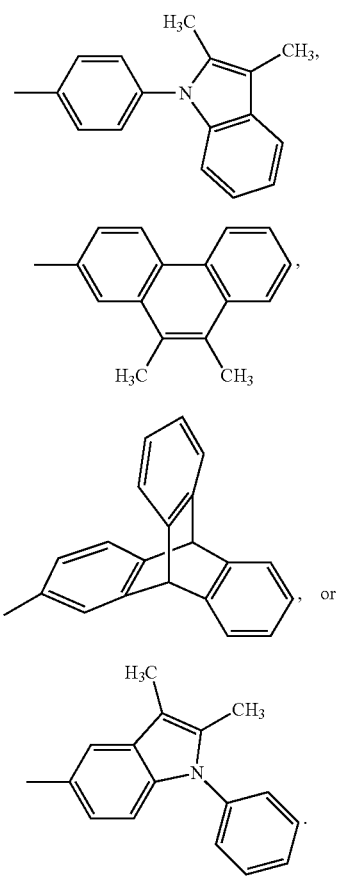

(iii)

(iv)

(v)

(vi)

In one embodiment, for Structure 1, R14 to R22 are each, independently, hydrogen or deuterium.

In one embodiment, for Structure 1, R23, R24, R37 and R38 are each, independently, hydrogen or deuterium.

In one embodiment, for Structure 1, R25, R26, R32 to R36 are each, independently, hydrogen or deuterium.

In one embodiment, Structure 1 is selected from the following structures (a) through (f):

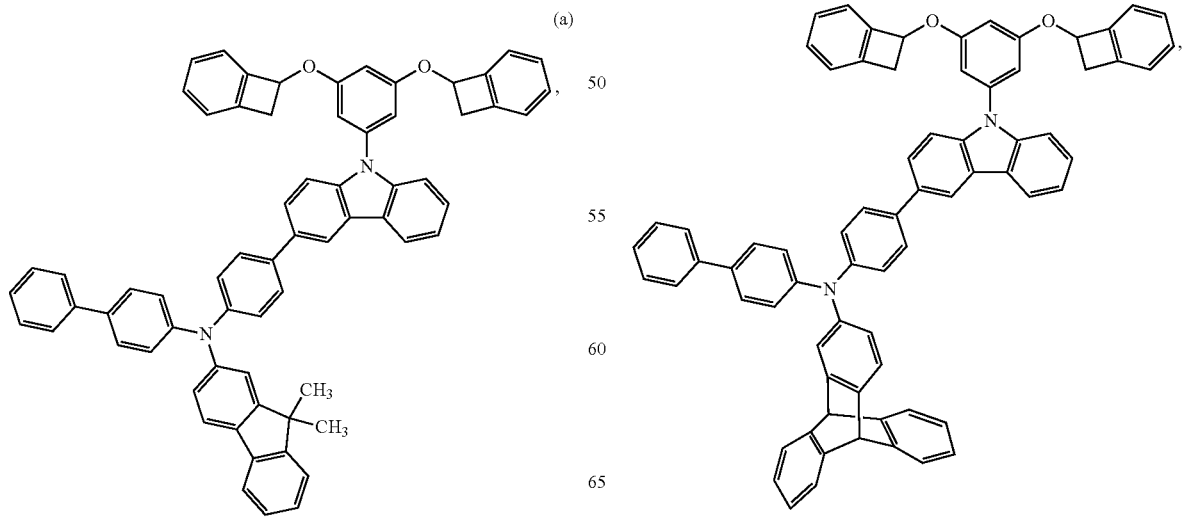

(a)

-continued

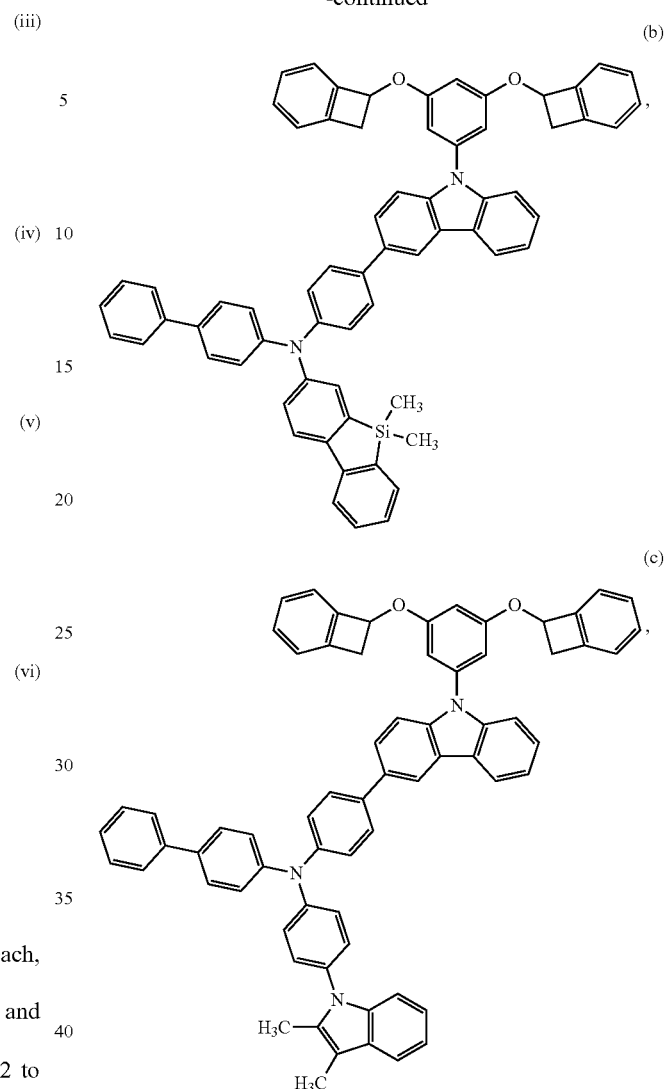

(b)

(c)

(d)

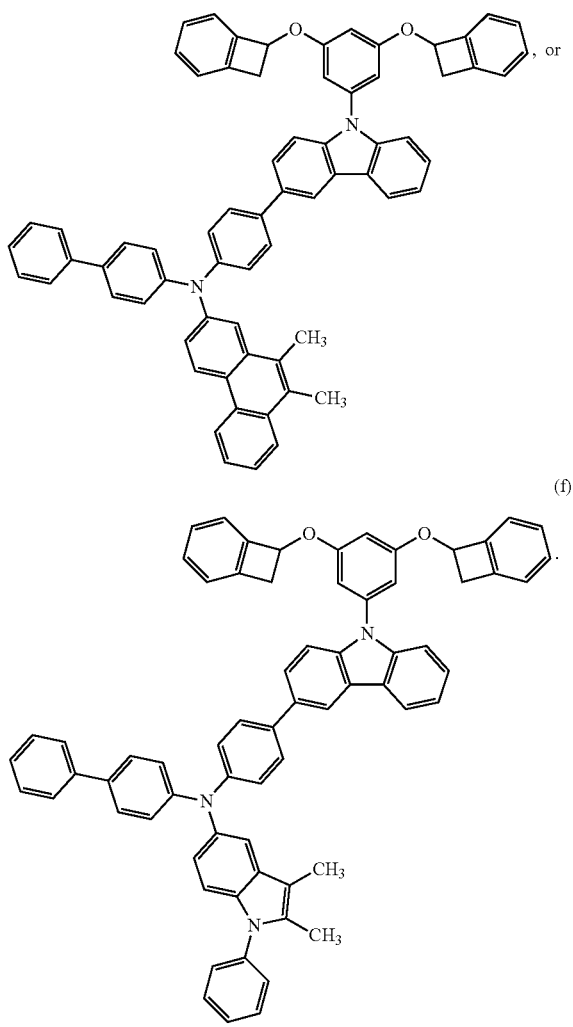

In one embodiment, Structure 1 is structure (a).

In one embodiment, Structure 1 has a molecular weight from 1400 g/mole to 28000 g/mole, further from 1400 g/mole to 14000 g/mole.

In one embodiment, Structure 1 has a molecular weight from 1400 g/mole to 8000 g/mole, further from 1400 g/mole to 5000 g/mole, further from 1400 g/mole to 3000 g/mole.

The invention also provides a charge transporting film comprising at least one Layer A formed from an inventive composition, as described herein, or an inventive composition from one or more embodiments as described herein.

The invention also provides a light emitting comprising an inventive film as described herein, or an inventive film from one or more embodiments as described herein.

The invention also provides a film comprising at least one Layer A formed from an inventive composition.

An inventive film may comprise a combination of two or more embodiments described herein. In a further embodiment, the film is crosslinked.

The invention also provides a charge transport film.

In a further embodiment, the film continues to transport charges with high mobility after crosslinking.

In a further embodiment, the transported charges are positively charged ('holes').

The invention provides an article comprising at least one component formed from an inventive composition.

In one embodiment, the article is an electroluminescent device.

The invention also provides an article comprising at least one component formed from an inventive film.

In one embodiment, the article is an electroluminescent device.

An inventive article may comprise a combination of two or more embodiments described herein.

An inventive composition may comprise a combination of two or more embodiments described herein.

In one embodiment, the inventive composition comprises at least one deuterium atom.

In one embodiment, the compound of Structure 1 has a purity greater than 99 percent.

In one embodiment, the composition comprises at least two compounds selected from Structure 1.

In one embodiment, the composition comprises from 50 to 90 weight percent of at least one compound selected from Structure 1, based on the weight of the composition. In a further embodiment, the composition comprises from 70 to 90 weight percent, further from 90 to 99 weight percent of at least one compound selected from Structure 1, based on the weight of the composition.

In one embodiment, the composition further comprises an organometal compound, and further a metal quinolate. In a further embodiment, the metal quinolate is a lithium quinolate with or without substituents.

In one embodiment, the organometal compound comprises lithium. In a further embodiment, the organometal is lithium quinolate with or without substituents.

In one embodiment, the weight ratio of the at least one compound (Structure 1) to the organometal compound is from 9/1 to 1/1, further from 4/1 to 1/1, further from 3/2 to 1/1.

DEFINITIONS

As used herein, the term "light emitting device," as used herein, refers to a device that emits light when an electrical current is applied across two electrodes.

As used herein, the term "polymeric charge transfer layer," as used herein, refers to a polymeric material that can transport charge carrying moieties, either holes or electrons.

As used herein, the term "cross-linking monomer," as used herein, refers to an organic or inorganic molecule that can join adjacent chains of a polymer by creating covalent bonds.

As used herein, the term "hole transporting solution-processed layer," as used herein, refers to a hole transporting layer which can be processed by solution-based methods, such as spin-coating, inkjet printing, and screen printing.

As used herein, the term "hole injection solution-processed layer," as used herein, refers to a hole injection layer which can be processed by solution-based methods, such as spin-coating, inkjet printing, and screen printing.

As used herein, the term "emissive solution-processed layer," as used herein, refers to an emissive layer which can be processed by solution-based methods, such as spin-coating, inkjet printing, and screen printing.

As used herein, the term "solvent-borne organic material," as used herein, refers to an organic compound that is dissolved or suspended in a solvent, whereby the solvent can be made volatile and evaporated.

As used herein, the term "electronic device," as used herein, refers to a device which depends on the principles of electronics, and uses the manipulation of electron flow for its operation.

As used herein, the term "alkoxy," as used herein, refers to a moiety containing a univalent organic radical consisting of an alkyl group attached oxygen.

As used herein, the term "aryloxy," as used herein, refers to a moiety containing a univalent organic radical consisting of an aryl group attached to oxygen As used herein, the term "charge transporting film," as used herein, refers to a film whereby charge is transported either intra- or inter-molecularly between one or more molecules.

The term "hydrocarbyl," as used herein, refers to a chemical group containing only hydrogen and carbon atoms. As used herein, hydrocarbyl includes monovalent, divalent, or higher valent groups. The valency of a hydrocarbyl can be determined by the chemical structure of the molecule comprising the hydrocarbyl.

The term "substituted hydrocarbyl," as used herein, refers to a hydrocarbyl in which at least one hydrogen atom is substituted with a heteroatom or a chemical group containing at least one heteroatom. Heteroatoms include, but are not limited to, O, N, P and S. Substituents include, but are not limited to, OR', NR'$_2$, PR'$_2$, P(=O)R'$_2$, SiR'$_3$; where each R' is a $C_1$-$C_{20}$ hydrocarbyl group.

The term "heterohydrocarbyl," as used herein, refers to a chemical group containing hydrogen and carbon atoms, and wherein at least one carbon atom or CH group or CH2 group is substituted with a heteroatom or a chemical group containing at least one heteroatom. Heteroatoms include, but are not limited to, O, N, P and S. As used herein, heterohydrocarbyl includes monovalent, divalent, or higher valent groups. The valency of a heterohydrocarbyl can be determined by the chemical structure of the molecule comprising the heterohydrocarbyl.

The term "substituted heterohydrocarbyl," as used herein, refers to a heterohydrocarbyl in which at least one hydrogen atom is substituted with a heteroatom or a chemical group containing at least one heteroatom. Heteroatoms include, but are not limited to, O, N, P and S. Substituents include, but are not limited to, OR', NR'$_2$, PR'$_2$, P(=O)R'$_2$, SiR'$_3$; where each R' is a $C_1$-$C_{20}$ hydrocarbyl group.

The term "aromatic moiety," as described herein, refers to an organic moiety derived from aromatic hydrocarbon by deleting at least one hydrogen atom therefrom. An aromatic moiety may be a monocyclic and/or fused ring system, each ring of which suitably contains from 4 to 7, preferably from 5 or 6 atoms. Structures wherein two or more aromatic moieties are combined through single bond(s) are also included. Specific examples include, but are not limited to, phenyl, naphthyl, biphenyl, anthryl, indenyl, fluorenyl, benzofluorenyl, phenanthryl, triphenylenyl, pyrenyl, perylenyl, chrysenyl, naphtacenyl, fluoranthenyl and the like, but are not restricted thereto. The naphthyl may be 1-naphthyl or 2-naphthyl, the anthryl may be 1-anthryl, 2-anthryl or 9-anthryl, and the fluorenyl may be any one of 1-fluorenyl, 2-fluorenyl, 3-fluorenyl, 4-fluorenyl and 9-fluorenyl. The valency of the aromatic moiety can be determined by the chemical structure of the molecule comprising the aromatic moiety.

The term "substituted aromatic moiety," as used herein, refers to an aromatic moiety in which at least one hydrogen atom is substituted with a heteroatom or a chemical group containing at least one heteroatom. Heteroatoms include, but are not limited to, O, N, P and S. Substituents include, but are not limited to, OR', NR'$_2$, PR'$_2$, P(=O)R'$_2$, SiR'$_3$; where each R' is a $C_{30}$-$C_{100}$ hydrocarbyl group.

The term "heteroaromatic moiety," as described herein, refers to an aromatic moiety, in which at least one carbon atom or CH group or CH2 group is substituted with a heteroatom (for example, B, N, O, S, P(=O), Si and P) or a chemical group containing at least one heteroatom. The heteroaromatic moiety may be a 5- or 6-membered monocyclic heteroaryl, or a polycyclic heteroaryl which is fused with one or more benzene ring(s), and may be partially saturated. The structures having one or more heteroaromatic moieties bonded through a single bond are also included. Specific examples include, but are not limited to, monocyclic heteroaryl groups, such as furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, pyridazinyl; polycyclic heteroaryl groups, such as benzofuranyl, fluoreno[4, 3-b]benzofuranyl, benzothiophenyl, fluoreno[4, 3-b]benzothiophenyl, isobenzofuranyl, benzimidazolyl, benzothiazolyl, benzisothiazolyl, benzisoxazolyl, benzoxazolyl, isoindolyl, indolyl, indazolyl, benzothia-diazolyl, quinolyl, isoquinolyl, cinnolinyl, quinazolinyl, quinoxalinyl, carbazolyl, phenanthridinyl and benzodioxolyl. The valency of the heteroaromatic moiety can be determined by the chemical structure of the molecule comprising the heteroaromatic moiety.

The term "substituted heteroaromatic moiety," as used herein, refers to a heteroaromatic moiety in which at least one hydrogen atom is substituted with a heteroatom or a chemical group containing at least one heteroatom. Heteroatoms include, but are not limited to, O, N, P and S. Substituents include, but are not limited to, OR', NR'$_2$, PR'$_2$, P(=O)R'$_2$, SiR'$_3$; where each R' is a $C_{30}$-$C_{100}$ hydrocarbyl group.

The term "aryl" as described herein, refers to an organic radical derived from aromatic hydrocarbon by deleting one hydrogen atom therefrom. An aryl group may be a monocyclic and/or fused ring system, each ring of which suitably contains from 4 to 7, preferably from 5 or 6 atoms. Structures wherein two or more aryl groups are combined through single bond(s) are also included. Specific examples include, but are not limited to, phenyl, naphthyl, biphenyl, anthryl, indenyl, fluorenyl, benzofluorenyl, phenanthryl, triphenylenyl, pyrenyl, perylenyl, chrysenyl, naphtacenyl, fluoranthenyl and the like, but are not restricted thereto. The naphthyl may be 1-naphthyl or 2-naphthyl, the anthryl may be 1-anthryl, 2-anthryl or 9-anthryl, and the fluorenyl may be any one of 1-fluorenyl, 2-fluorenyl, 3-fluorenyl, 4-fluorenyl and 9-fluorenyl.

The term "substituted aryl," as used herein, refers to an aryl in which at least one hydrogen atom is substituted with a heteroatom or a chemical group containing at least one heteroatom. Heteroatoms include, but are not limited to, O, N, P and S. Substituents include, but are not limited to, OR', NR'$_2$, PR'$_2$, P(=O)R'$_2$, SiR'$_3$; where each R' is a $C_1$-$C_{20}$ hydrocarbyl group.

The terms "heteroaryl" as described herein, refers to an aryl group, in which at least one carbon atom or CH group or CH2 group is substituted with a heteroatom (for example, B, N, O, S, P(=O), Si and P) or a chemical group containing at least one heteroatom. The heteroaryl may be a 5- or 6-membered monocyclic heteroaryl or a polycyclic heteroaryl which is fused with one or more benzene ring(s), and may be partially saturated. The structures having one or more heteroaryl group(s) bonded through a single bond are also included. The heteroaryl groups may include divalent aryl groups of which the heteroatoms are oxidized or quarternized to form N-oxides, quaternary salts, or the like. Specific examples include, but are not limited to, monocyclic heteroaryl groups, such as furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, pyridazinyl; polycyclic heteroaryl groups, such as benzofuranyl, fluoreno[4, 3-b]benzofuranyl, benzothiophenyl, fluoreno[4, 3-b]benzothiophenyl, isobenzofuranyl, benzimidazolyl, benzothiazolyl, benzisothiazolyl, benzisoxazolyl, benzoxazolyl, isoindolyl, indolyl, indazolyl, benzothia-diazolyl, quinolyl, isoquinolyl, cinnolinyl, quinazolinyl, quinoxalinyl, carbazolyl, phenanthridinyl and benzodioxolyl; and corresponding N-oxides (for example, pyridyl N-oxide, quinolyl N-oxide) and quaternary salts thereof.

The term "substituted heteroaryl," as used herein, refers to a heteroaryl in which at least one hydrogen atom is substituted with a heteroatom or a chemical group containing at least one heteroatom. Heteroatoms include, but are not limited to, O, N, P and S. Substituents include, but are not limited to, OR', NR'$_2$, PR'$_2$, P(=O)R'$_2$, SiR'$_3$; where each R' is a $C_1$-$C_{20}$ hydrocarbyl group.

The term "polymer," as used herein, refers to a polymeric compound prepared by polymerizing monomers, whether of the same or a different type. The generic term polymer thus embraces the term homopolymer (employed to refer to polymers prepared from only one type of monomer, with the understanding that trace amounts of impurities can be incorporated into and/or within the polymer structure), and the term interpolymer as defined hereinafter.

The term "interpolymer," as used herein, refers to polymers prepared by the polymerization of at least two different types of monomers. The generic term interpolymer thus includes copolymers (employed to refer to polymers prepared from two different types of monomers), and polymers prepared from more than two different types of monomers.

EXPERIMENTAL

Reagents and Test Methods

All solvents and reagents were obtained from commercial vendors (for example, Sigma-Aldrich, TCI, and Alfa Aesar), and were used in the highest available purities, and/or when necessary, recrystallized before use. Dry solvents were obtained from in-house purification/dispensing system (hexane, toluene, and tetrahydrofuran), or purchased from Sigma-Aldrich. All experiments involving "water sensitive compounds" were conducted in "oven dried" glassware, under nitrogen atmosphere, or in a glovebox. Reactions were monitored by analytical, thin-layer chromatography (TLC) on precoated aluminum plates (VWR 60 F254), and visualized by UV light and/or potassium permanganate staining. Flash chromatography was performed on an ISCO COMBIFLASH system with GRACERESOLV cartridges.

$^1$H-NMR-spectra (500 MHz or 400 MHz) were obtained on a Varian VNMRS-500 or VNMRS-400 spectrometer, at 30° C., unless otherwise noted. The chemical shifts were referenced to TMS (δ=0.00) in CDCl$_3$.

$^{13}$C-NMR spectra (125 MHz or 100 MHz) were obtained on a Varian VNMRS-500 or VNRMS-400 spectometer, and referenced to TMS (δ=0.00) in CDCl$_3$.

Synthesis of 1,3-bis(bicyclo[4.2.0]octa-1(6),2,4-trien-7-yloxy)-5-iodobenzene

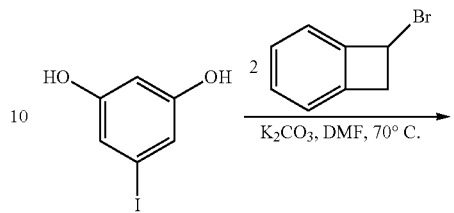

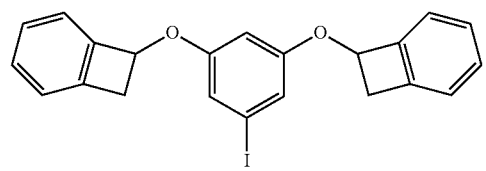

To a flask, charged with 3-iodoresorcinol (1 equiv) and K$_2$CO$_3$ (4 equiv), was added DMF. The solution was stirred at room temperature, and 7-bromobicyclo[4.2.0]octa-1,3,5-triene (2.5 equiv) was added dropwise as a DMF solution. The mixture was heated to 70° C. for two days. After cooling to room temperature, the mixture was poured into water (100 mL), and extracted several times with diethyl ether. The organic fractions were collected, washed with brine, and dried with MgSO$_4$. The organic fraction was filtered, and the solvent removed to provide a yellow oil. After recrystallization from methanol, a pale yellow solid was recovered; this was identified by NMR spectroscopy and consistent with the formation of the product.

Synthesis of N-([1,1'-biphenyl]-4-yl)-N-(4-bromophenyl)-9,9-dimethyl-9H-fluoren-2-amine

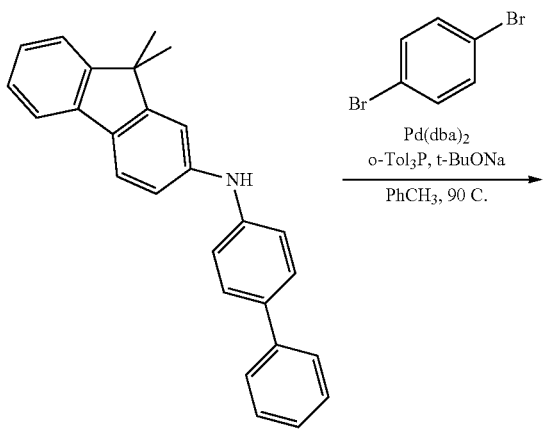

27

-continued

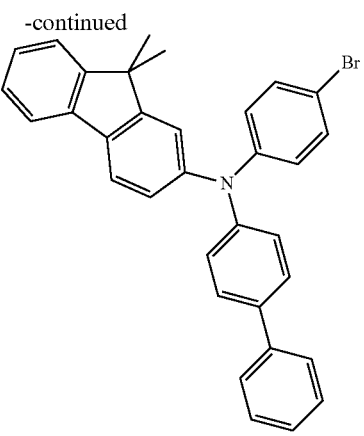

To a flask, charged with N-([1,1'-biphenyl]-4-yl)-9,9-dimethyl-9H-fluoren-2-amine (1.0 equiv), 1,4-dibromobenzene (2.0 equiv), Pd2dba3 (0.02 equiv), tri-ortho-toluyl phosphine (0.06 equiv) and sodium tert-butoxide (2.0 equiv), was added toluene. The mixture was heated to reflux for 18 hours. The reaction was cooled to room temperature, and washed with water and brine. The organic phase was dried over MgSO$_4$, and concentrated. The resulting residue was purified, via a silica gel column, to afford the desired product as a white solid.

Synthesis of N-([1,1'-biphenyl]-4-yl)-N-(4-bromophenyl)-9,9-dimethyl-9H-fluoren-2-amine

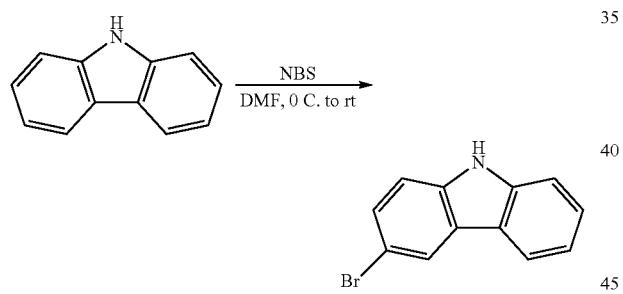

The compound was synthesized using a previously published procedure disclosed in Midya et al. *Chem. Commun.* 2010, 46, 2091, incorporated herein by reference.

Synthesis of 3-(4,4,5,5-tetramethyl-1,3,2-dioxaborolan-2-yl)-9H-carbazole

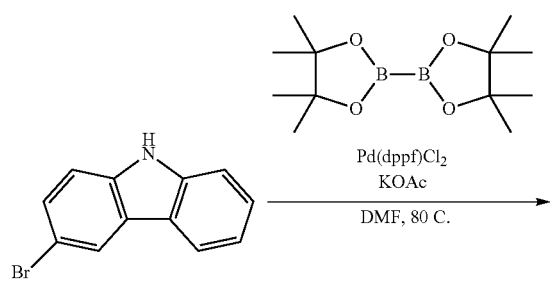

28

-continued

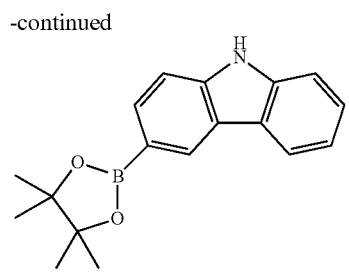

The compound was synthesized using a previously published procedure disclosed in U.S. Patent Application US2005/0137204 A1, incorporated herein by reference.

Synthesis of N-(4-(9H-carbazol-3-yl)phenyl)-N-([1,1'-biphenyl]-4-yl)-9,9-dimethyl-9H-fluoren-2-amine To a flask, charged with N-([1,1'-biphenyl]-4-yl)-N-(4-bromophenyl)-9,9-dimethyl-9H-fluoren-2-amine (1.2 equiv) and palladium tetrakis(triphenylphsophine) (0.03 equiv), in toluene (0.2 M), under N$_2$, was added, 3-(4,4,5,5-tetramethyl-1,3,2-dioxaborolan-2-yl)-9H-carbazole (1.0 equiv), in ethanol (0.17 M), and an aqueous potassium carbonate solution (4.0 equiv, 2.0 M). The mixture was heated to 90° C. for 12 hours. The reaction was cooled to room temperature, and concentrated under vacuum. The resulting residue was diluted into methylene chloride, and washed with water. The organic phase was dried over Na$_2$SO$_4$, and concentrated. The resulting residue was purified via silica gel chromatography to afford the desired product as a white solid.

Synthesis of N-([1,1'-biphenyl]-4-yl)-N-(4-(9-(3,5-bis(bicyclo[4.2.0]octa-1(6),2,4-trien-7-yloxy)phenyl)-9H-carbazol-3-yl)phenyl)-9,9-dimethyl-9H-fluoren-2-amine

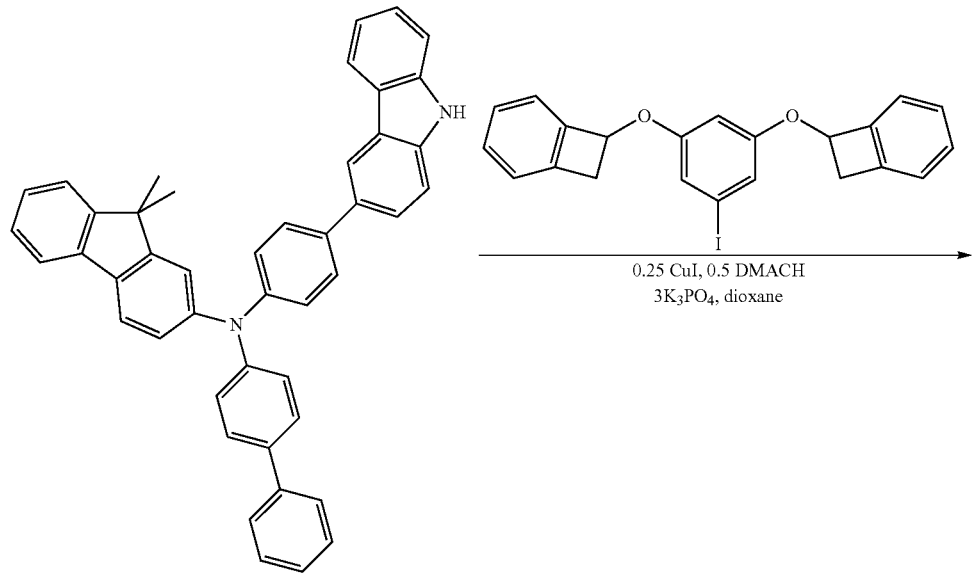

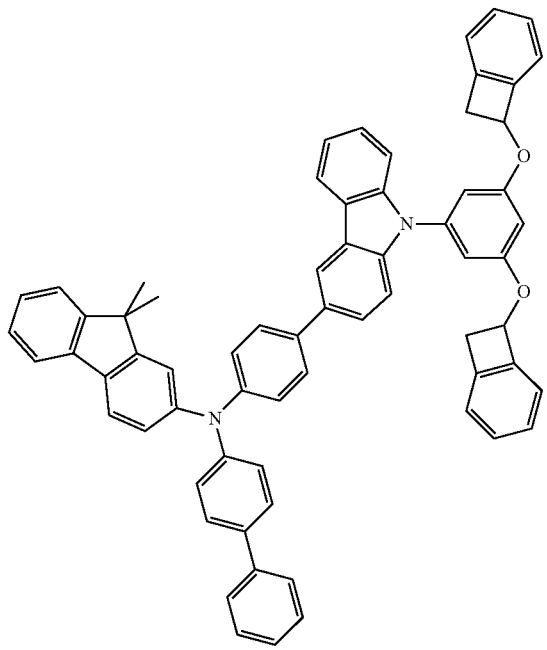

To a flask, charged with N-(4-(9H-carbazol-3-yl)phenyl)-N-([1,1'-biphenyl]-4-yl)-9,9-dimethyl-9H-fluoren-2-amine (1 equiv), 1,3-bis(bicyclo[4.2.0]octa-1(6),2,4-trien-7-yloxy)-5-iodobenzene (1.1 equiv), copper iodide (0.25 equiv), and $K_3PO_4$ (3 equiv), was added dioxane. The mixture was stirred for 5 minutes, and N,N'-dimethylcyclohexane-1,2-diamine (0.5 equiv) added, dropwise, to the stirring mixture. The mixture was heated to 70° C. for two days. After cooling to room temperature, the solvent was removed by rotary evaporation, and extracted with $CH_2Cl_2$ and water. The aqueous volume was further extracted with $CH_2Cl_2$ twice. The organic fractions were combined, washed with brine, and dried with $MgSO_4$. The organic fractions were filtered, and the solvent removed to yield the crude product. The resulting residue was purified via silica gel chromatography, to afford the desired product as a white solid.

The inventive compositions can be used to form hole-transporting materials for use in electroluminescent devices. For example, an inventive composition can be used to form a "light emitting device as follows. An indium tin oxide (ITO) glass substrate (2*2 cm) can be cleaned, and then treated with a UV Ozone cleaner for 15 minutes. The hole injection layer (HIL) material can be spin-coated, from a water solution, onto the ITO substrates, in a glovebox (for example, Argon atmosphere), and annealed at 150° C. for 20 minutes. The substrate can be transferred into a thermal evaporator for the deposition of an HTL layer. For an inventive composition (HTL), the composition can be deposited from anisole solution, and annealed at 150° C. for 10 minutes, to remove organic solvent. After that, the crosslinking of polymeric HTL can be carried out on a hotplate, in a glovebox, at 205° C. for 10 minutes. Then an emitting layer (EML), an electron transfer layer (ETL), and a cathode can be sequentially deposited. Finally the device can be hermetically sealed, prior to testing.

The invention claimed is:

1. A light emitting device comprising a polymeric charge transfer layer, wherein the polymeric charge transfer layer is formed from a composition comprising a polymer, said polymer comprising one or more polymerized units derived from Structure A:

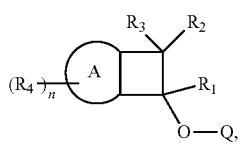

(Structure A)

wherein for Structure A, A is selected from an aromatic moiety or a heteroaromatic moiety; and R1 through R3 are each independently selected from the following: hydrogen, deuterium, a hydrocarbyl, a substituted hydrocarbyl, a heterohydrocarbyl, a substituted heterohydrocarbyl, halogen, cyano, a aryl, a substituted aryl, a heteroaryl, a substituted heteroaryl; and wherein n is from 1 to 10; and each R4 is independently selected from the following: hydrogen, deuterium, a hydrocarbyl, a substituted hydrocarbyl, a heterohydrocarbyl, a substituted heterohydrocarbyl, halogen, cyano, a aryl, a substituted aryl, a heteroaryl, a substituted heteroaryl; and wherein each R4 group is independently bonded to A; and wherein O is oxygen; and wherein Q is selected from the following: hydrogen, deuterium, a hydrocarbyl, a substituted hydrocarbyl, a heterohydrocarbyl, a substituted heterohydrocarbyl, a halogen, a cyano, an aryl, a substituted aryl, a heteroaryl, a substituted heteroaryl; and wherein two or more of R1 through R4 may optionally form one or more ring structures; wherein the polymer further comprises one or more polymerized units derived from a cross-linking agent selected from the following 1i)-8i):

1i)

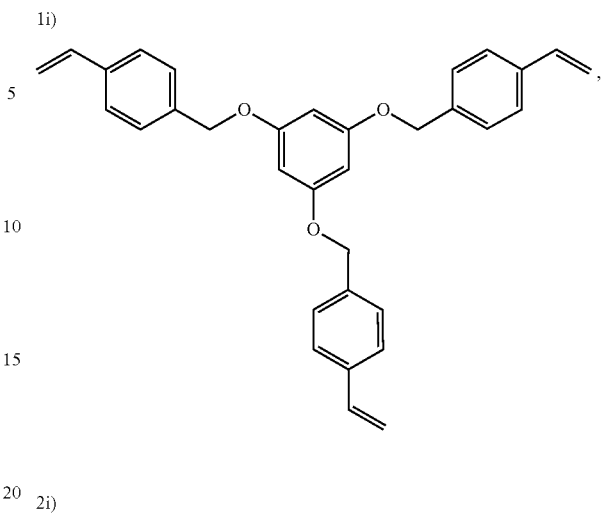

2i)

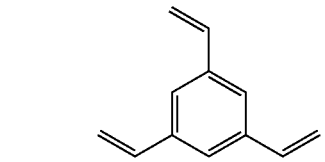

3i)

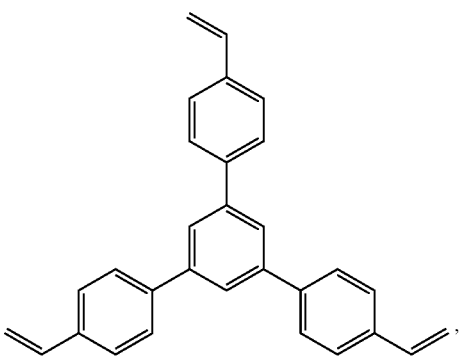

4i)

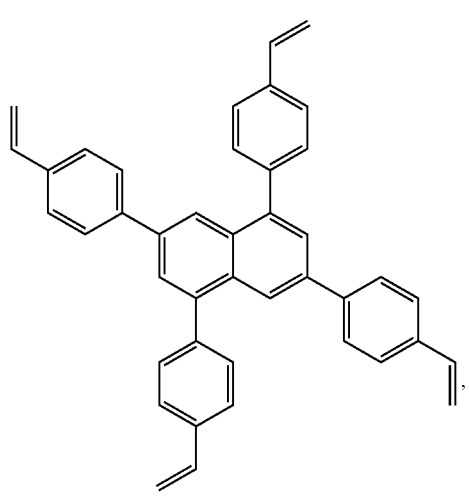

5i)
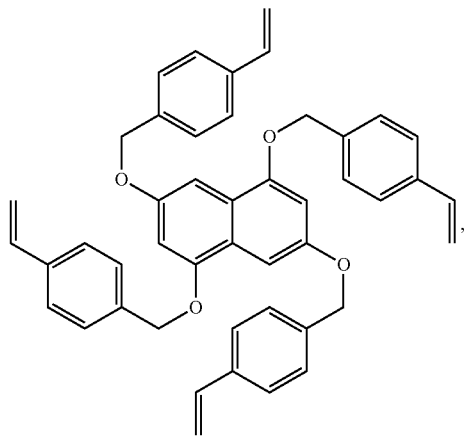
6i)
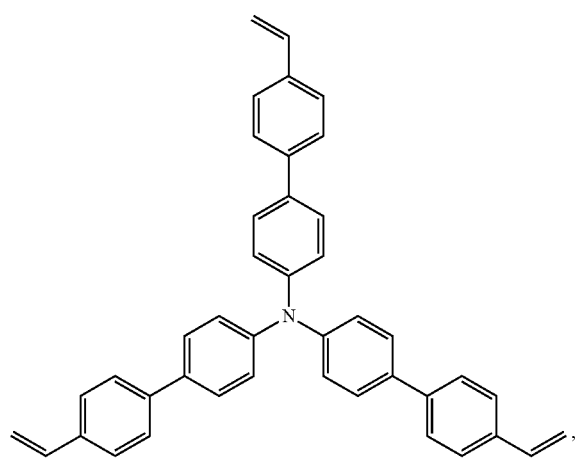
7i)
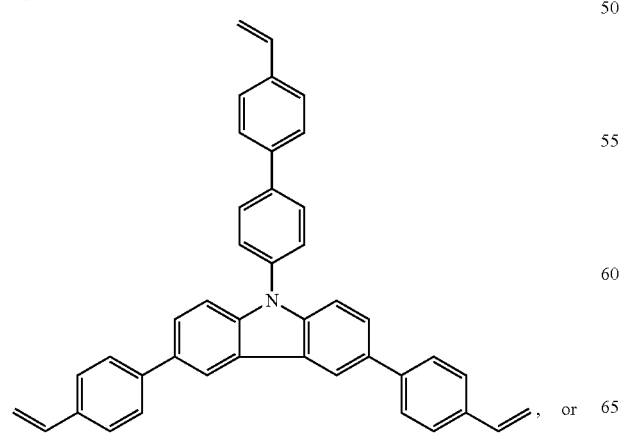, or
8i)
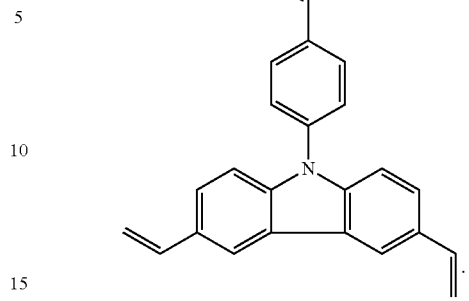
2. The device of claim 1, wherein Structure A is selected from the following A1)-A8):
A1)
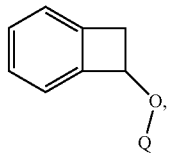
A2)
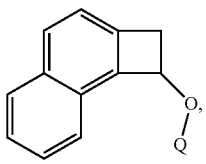
A3)
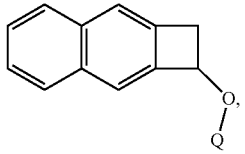
A4)
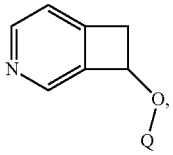
A5)
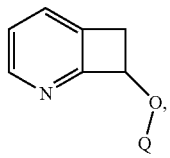
A6)
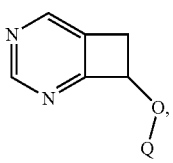

-continued

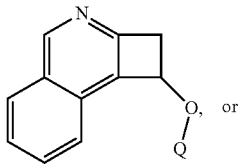
A7)

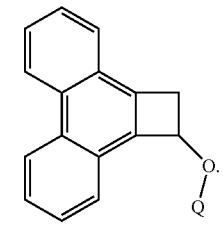
A8)

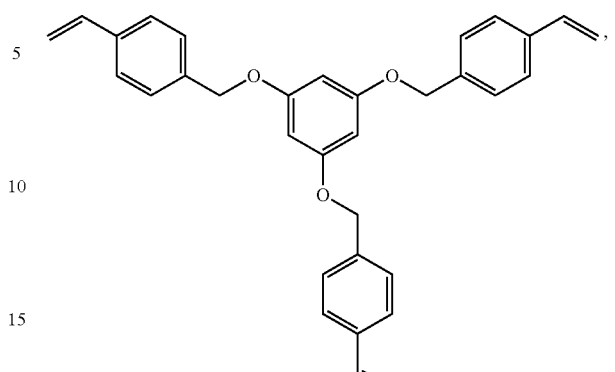
1i)

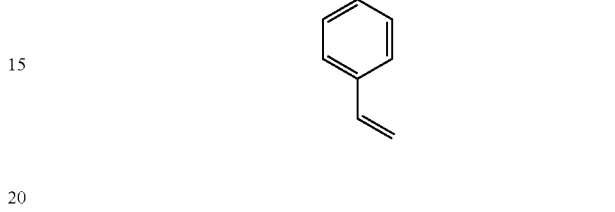
2i)

3. A composition comprising a polymer, which comprises one or more polymerized units derived from the Structure A:

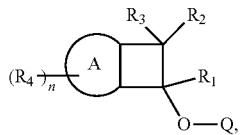
(Structure A)

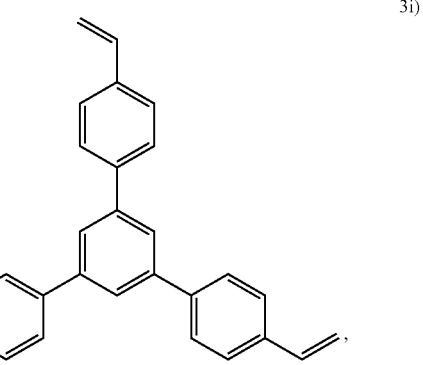
3i)

wherein, for Structure A, A is selected from an aromatic moiety or a heteroaromatic moiety; and R1 through R3 are each independently selected from the following: hydrogen, deuterium, a hydrocarbyl, a substituted hydrocarbyl, a heterohydrocarbyl, a substituted heterohydrocarbyl, halogen, cyano, a aryl, a substituted aryl, a heteroaryl, a substituted heteroaryl; and wherein n is from 1 to 10; and each R4 is independently selected from the following: hydrogen, deuterium, a hydrocarbyl, a substituted hydrocarbyl, a heterohydrocarbyl, a substituted heterohydrocarbyl, halogen, cyano, a aryl, a substituted aryl, a heteroaryl, a substituted heteroaryl; and wherein each R4 group is independently bonded to A; and wherein O is oxygen; and wherein Q is selected from the following: hydrogen, deuterium, a hydrocarbyl, a substituted hydrocarbyl, a heterohydrocarbyl, a substituted heterohydrocarbyl, halogen, cyano, a aryl, a substituted aryl, a heteroaryl, a substituted heteroaryl; and wherein two or more of R1 through R4 may optionally form one or more ring structures wherein the polymer further comprises one or more polymerized units derived from a cross-linking agent selected from the following 1i)-8i):

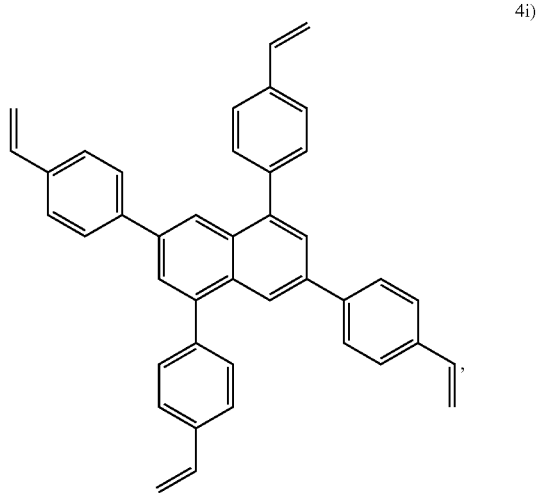
4i)

37
-continued
5i)
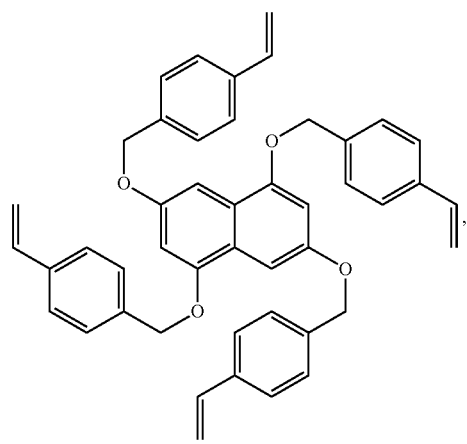
6i)
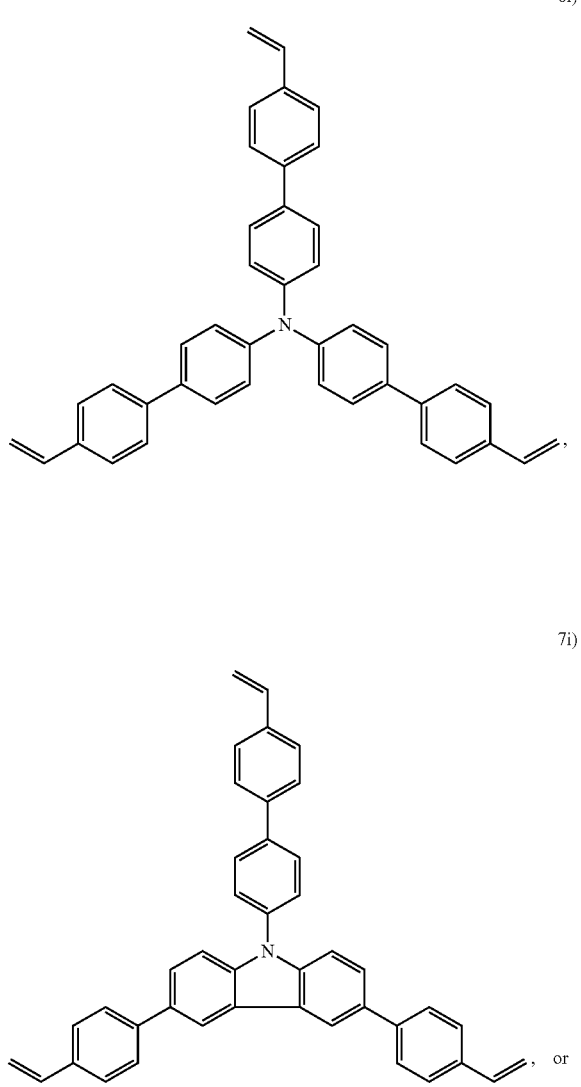
7i)
38
-continued
8i)
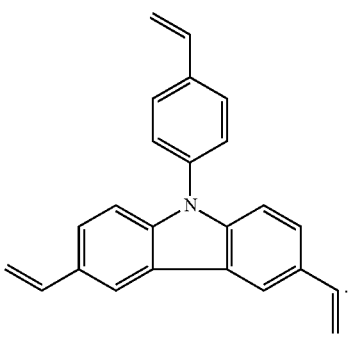
4. The composition of claim 3, wherein Structure A is selected from the following A1 through A8:
A1)
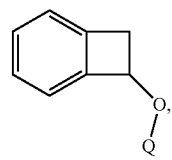
A2)
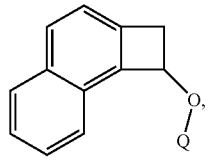
A3)
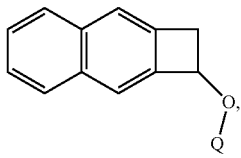
A4)
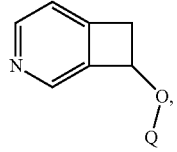
A5)
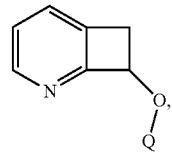
A6)
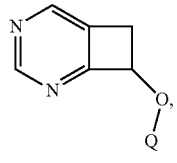

-continued

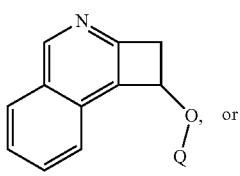

A7)

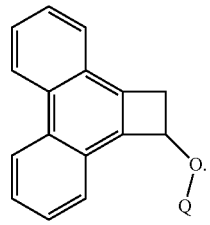

A8)

5. A composition comprising at least one compound selected from Structure 1:

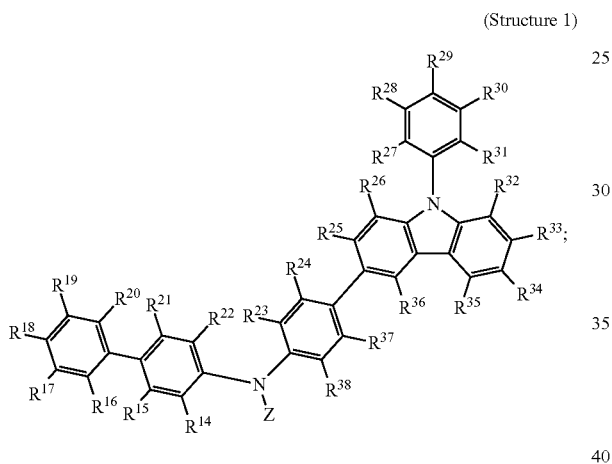

(Structure 1)

wherein groups R14 to R38 are each, independently, selected from a hydrogen, deuterium, hydrocarbyl, a substituted hydrocarbyl, a cyano, alkoxy, aryloxy, or NR'2, and wherein each R' is independently hydrogen, an alkyl, a substituted alkyl, a heteroalkyl, or a substituted heteroalkyl; and wherein two or more of R14 to R38 may optionally form one or more ring structures; and wherein one or more of groups R14 to R38 are each, independently, selected from the following Structure 2:

2.

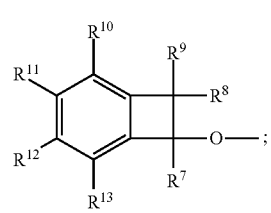

(Structure 2)

wherein groups R7 to R13 are each, independently, selected from hydrogen, deuterium, a hydrocarbyl, a substituted hydrocarbyl, a cyano, an alkoxy, or an aryloxy; and wherein, for Structure 1, Z is selected from an aryl, a substituted aryl, a heteroaryl, or a substituted heteroaryl.

6. The composition of claim 5, wherein Structure 2 is the following:

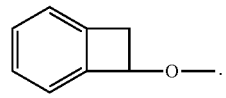

7. The composition of claim 5, wherein Z is selected from the following groups (i) through (vi):

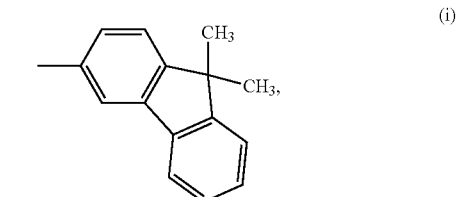
(i)

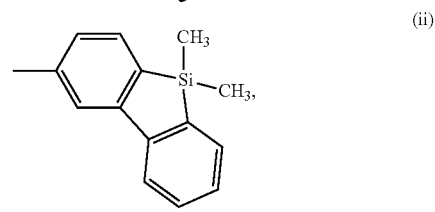
(ii)

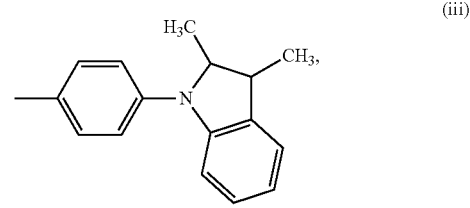
(iii)

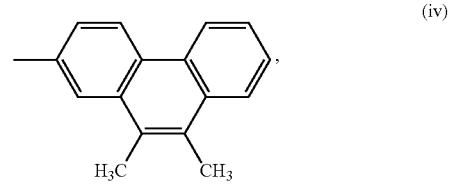
(iv)

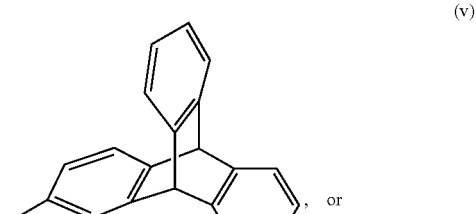
(v)

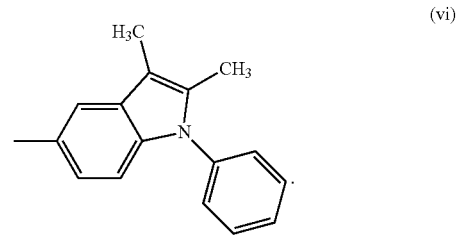
(vi)

8. The composition of claim 5, wherein Structure 1 is selected from the following structures (a) through (f):
(a)
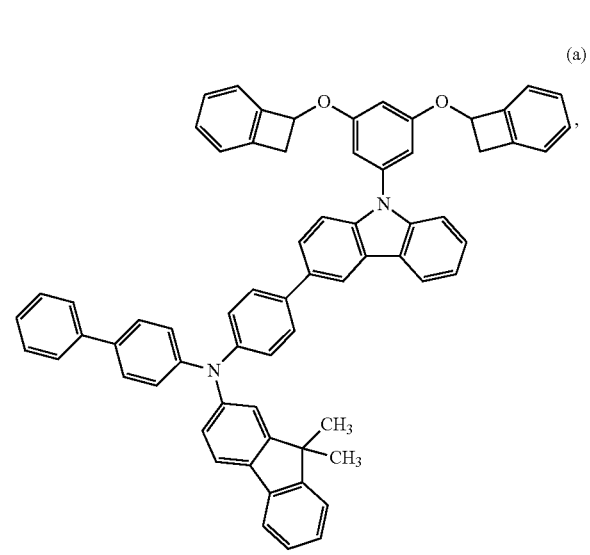
(b)
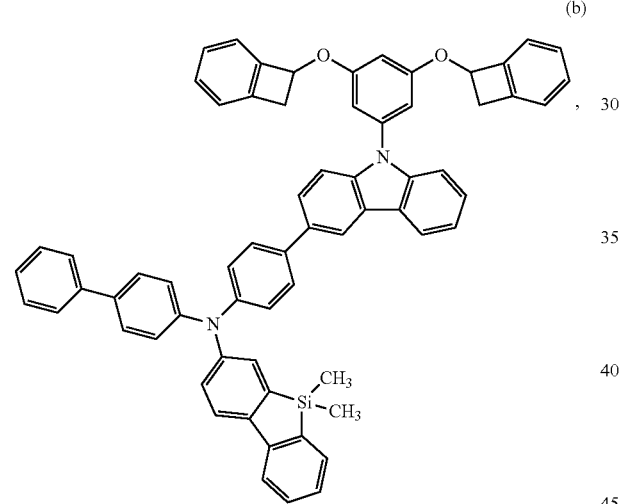
(c)
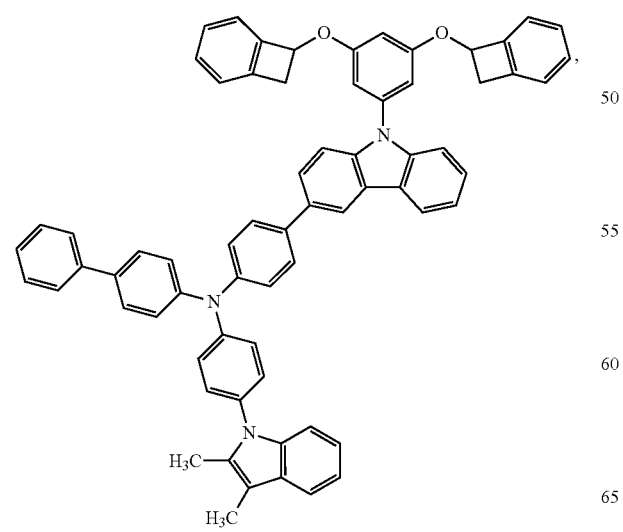
-continued
(d)
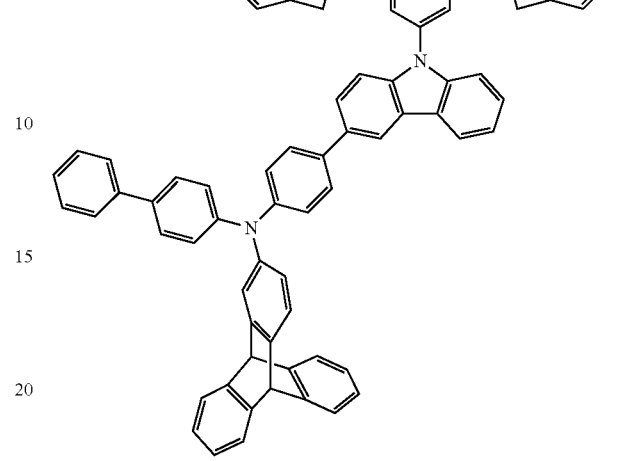
(e)
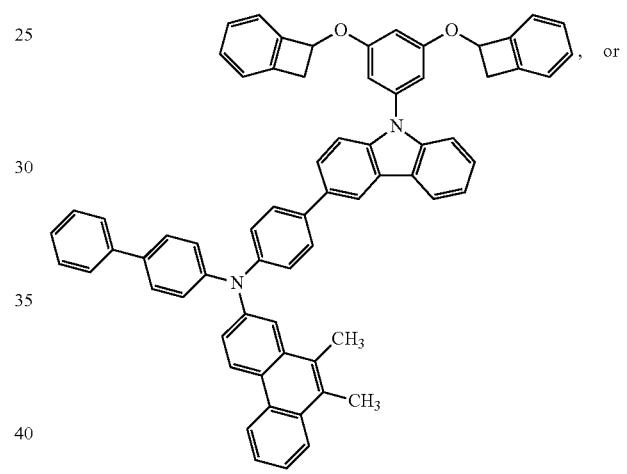, or
(f)
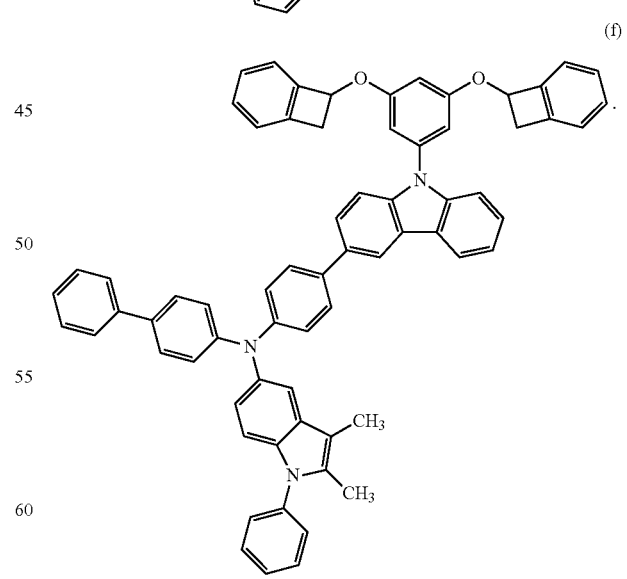
9. The composition of claim 5 further comprising one or more cross-linking agents selected from the following 1i)-8i):

1i)
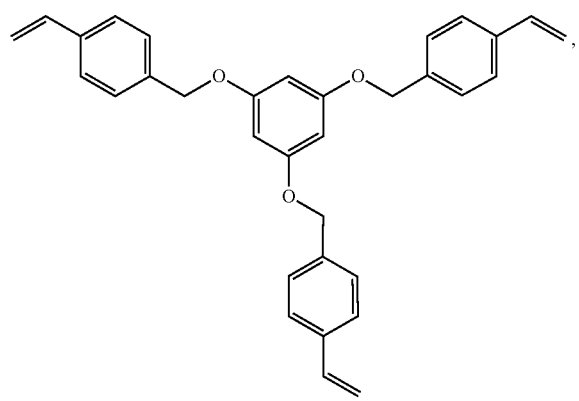
2i)
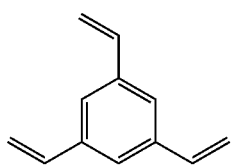
3i)
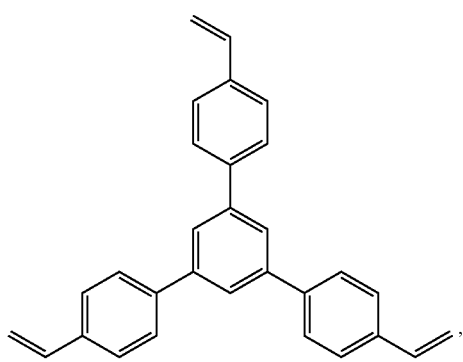
4i)
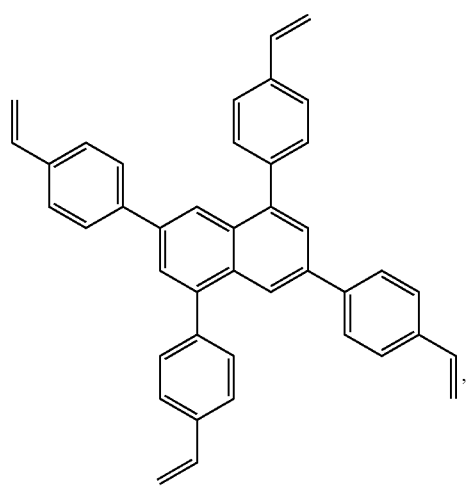
5i)
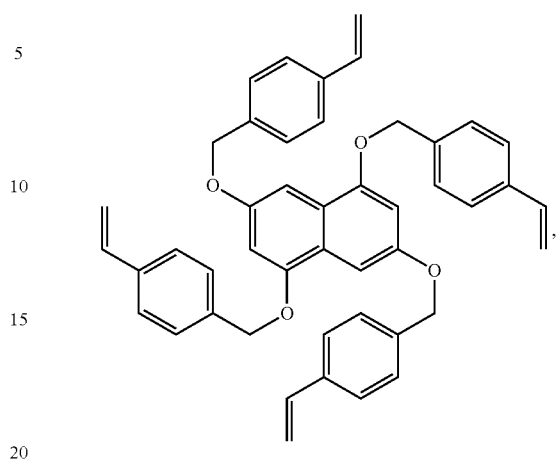
6i)
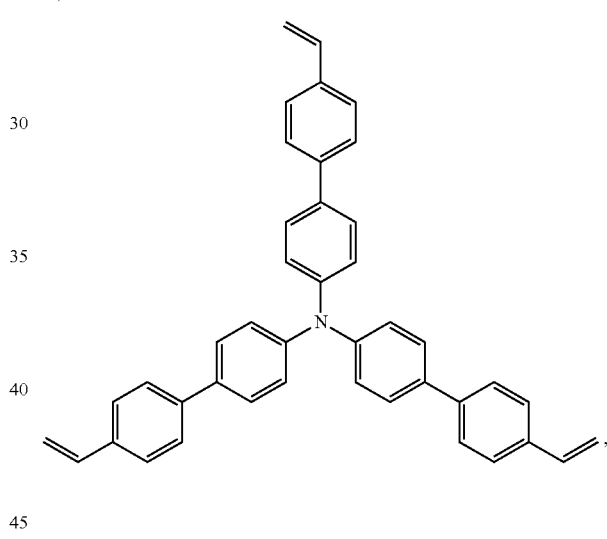
7i)
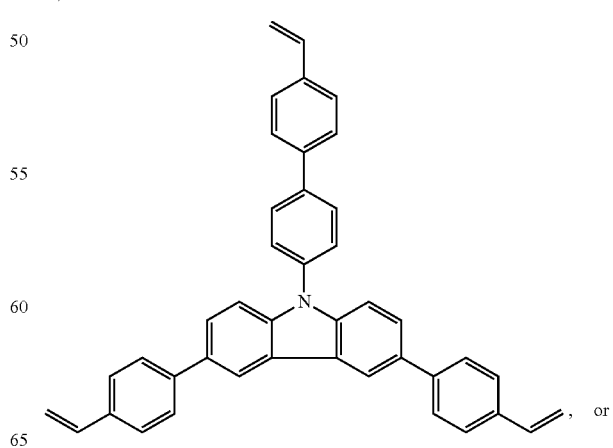
, or 8i)

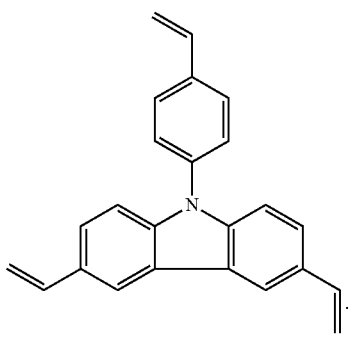

10. A polymer comprising one or more polymerized units derived from Structure 1:

(Structure 1)

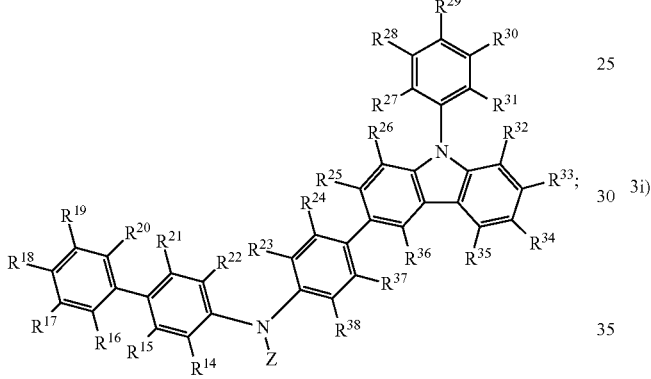

wherein groups R14 to R38 are each, independently, selected from a hydrogen, deuterium, hydrocarbyl, a substituted hydrocarbyl, a cyano, alkoxy, aryloxy, or NR'2, and wherein each R' is independently hydrogen, an alkyl, a substituted alkyl, a heteroalkyl, or a substituted heteroalkyl; and wherein two or more of R14 to R38 may optionally form one or more ring structures; and wherein one or more of groups R14 to R38 are each, independently, selected from the following Structure 2:

(Structure 2)

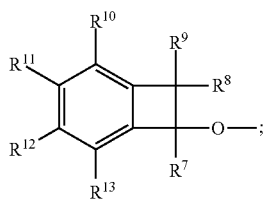

wherein groups R7 to R13 are each, independently, selected from hydrogen, deuterium, a hydrocarbyl, a substituted hydrocarbyl, a cyano, an alkoxy, or an aryloxy; and wherein, for Structure 1, Z is selected from an aryl, a substituted aryl, a heteroaryl, or a substituted heteroaryl;

and one or more cross-linking agents selected from the following 1i)-8i).

1i)

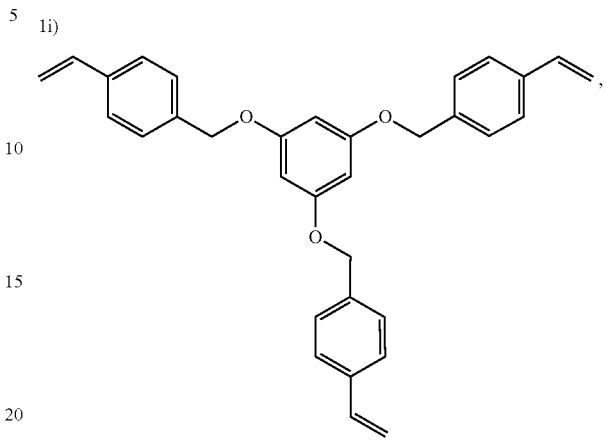

2i)

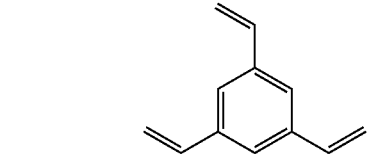

3i)

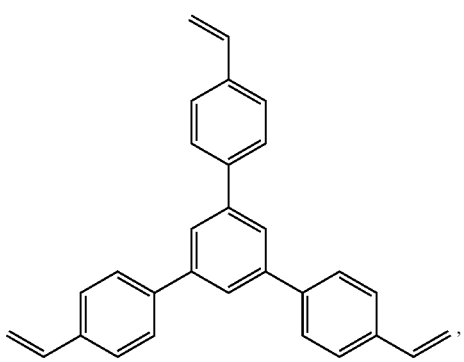

4i)

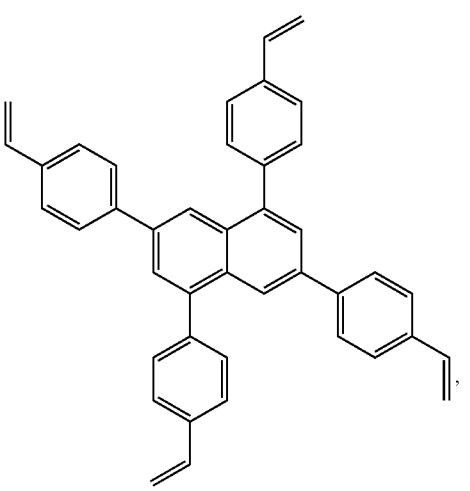

5i)
6i)
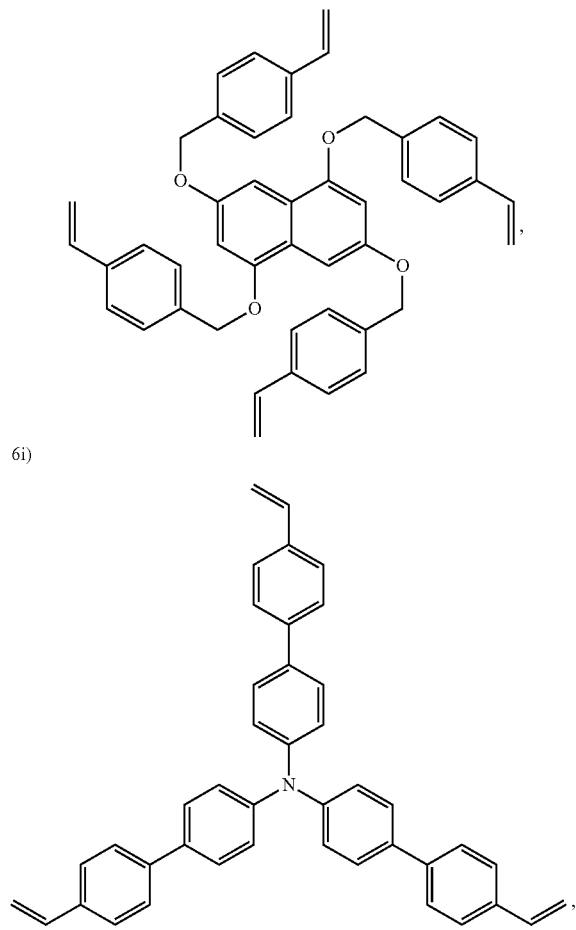
7i)
8i)
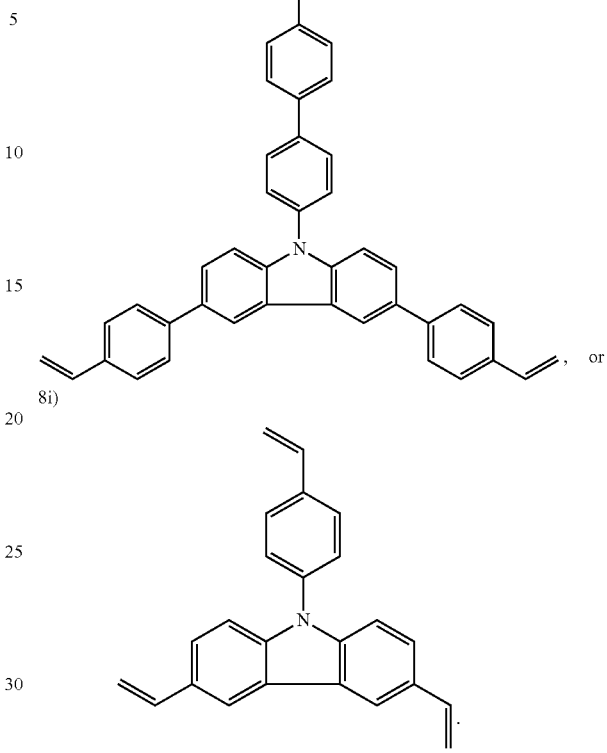
11. A light emitting device comprising a polymeric charge transfer layer, wherein the polymeric charge transfer layer comprises the polymer of claim 10.
* * * * *